US012602341B2

(12) United States Patent
Kim et al.

(10) Patent No.: US 12,602,341 B2
(45) Date of Patent: Apr. 14, 2026

(54) MEMORY EXPANDER AND COMPUTING SYSTEM INCLUDING THE SAME

(71) Applicant: SAMSUNG ELECTRONICS CO., LTD., Suwon-si (KR)

(72) Inventors: Kyungsoo Kim, Suwon-si (KR); Jinin So, Suwon-si (KR); Yongsuk Kwon, Suwon-si (KR); Jin Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 53 days.

(21) Appl. No.: 18/448,701

(22) Filed: Aug. 11, 2023

(65) Prior Publication Data

US 2024/0211424 A1     Jun. 27, 2024

(30) Foreign Application Priority Data

Dec. 21, 2022    (KR) ........................ 10-2022-0180229

(51) Int. Cl.
| | |
|---|---|
| *G06F 13/40* | (2006.01) |
| *G06F 11/07* | (2006.01) |
| *G11C 5/14* | (2006.01) |

(52) U.S. Cl.
CPC ...... *G06F 13/4022* (2013.01); *G06F 11/0772* (2013.01); *G06F 13/4068* (2013.01); *G11C 5/148* (2013.01)

(58) Field of Classification Search
CPC ............. G06F 11/0772; G06F 13/4022; G06F 13/4068; G11C 5/148
See application file for complete search history.

(56) References Cited

U.S. PATENT DOCUMENTS

| | | | | |
|---|---|---|---|---|
| 11,348,620 | B1 * | 5/2022 | Lambert | ............. G06F 11/3037 |
| 11,416,431 | B2 | 8/2022 | Malladi et al. | |
| 2006/0095592 | A1 * | 5/2006 | Borkenhagen | ...... G06F 13/1684 |
| | | | | 710/2 |
| 2007/0022281 | A1 * | 1/2007 | Haustein | ................. H04L 67/34 |
| | | | | 713/1 |
| 2014/0122797 | A1 * | 5/2014 | Yadav | .................... G06F 3/061 |
| | | | | 711/114 |

(Continued)

FOREIGN PATENT DOCUMENTS

| | | |
|---|---|---|
| KR | 100949551 B1 | 3/2010 |

*Primary Examiner* — Eric T Oberly
(74) *Attorney, Agent, or Firm* — Wolf, Greenfield & Sacks, P.C.

(57) ABSTRACT

A memory expander includes memory sub-modules, power management integrated circuits, a controller, and a power controller. The memory sub-modules store data, and each of the memory sub-modules includes one or more memories. The power management integrated circuits independently supply powers to the memory sub-modules, respectively. The controller communicates with an external device through an interface (e.g., compute express link (CXL)), controls operations of the memory sub-modules, and checks whether the memory sub-modules are abnormal. The power controller controls operations of the power management integrated circuits. In response to a first memory sub-module becoming abnormal, the power controller controls a first power management integrated circuit to block a first power supplied to the first memory sub-module.

20 Claims, 20 Drawing Sheets

(56)          References Cited

U.S. PATENT DOCUMENTS

| 2020/0004704 | A1* | 1/2020 | Chou | .................... | G06F 11/325 |
| 2020/0192798 | A1* | 6/2020 | Natu | ....................... | G06F 12/12 |
| 2020/0335141 | A1* | 10/2020 | Lee | .................... | G11C 11/4074 |
| 2021/0064114 | A1 | 3/2021 | Troia | | |
| 2021/0255681 | A1* | 8/2021 | Olarig | ................. | G06F 13/1668 |
| 2021/0407553 | A1 | 12/2021 | Heymann et al. | | |
| 2022/0137865 | A1* | 5/2022 | Lee | ....................... | G06F 3/0655 |
| | | | | | 711/154 |
| 2022/0139454 | A1 | 5/2022 | Robertson et al. | | |
| 2022/0225506 | A1 | 7/2022 | Lee et al. | | |
| 2022/0283974 | A1 | 9/2022 | Long | | |
| 2023/0376213 | A1* | 11/2023 | Huang | ................. | G06F 3/0673 |

\* cited by examiner

Figure 2A:
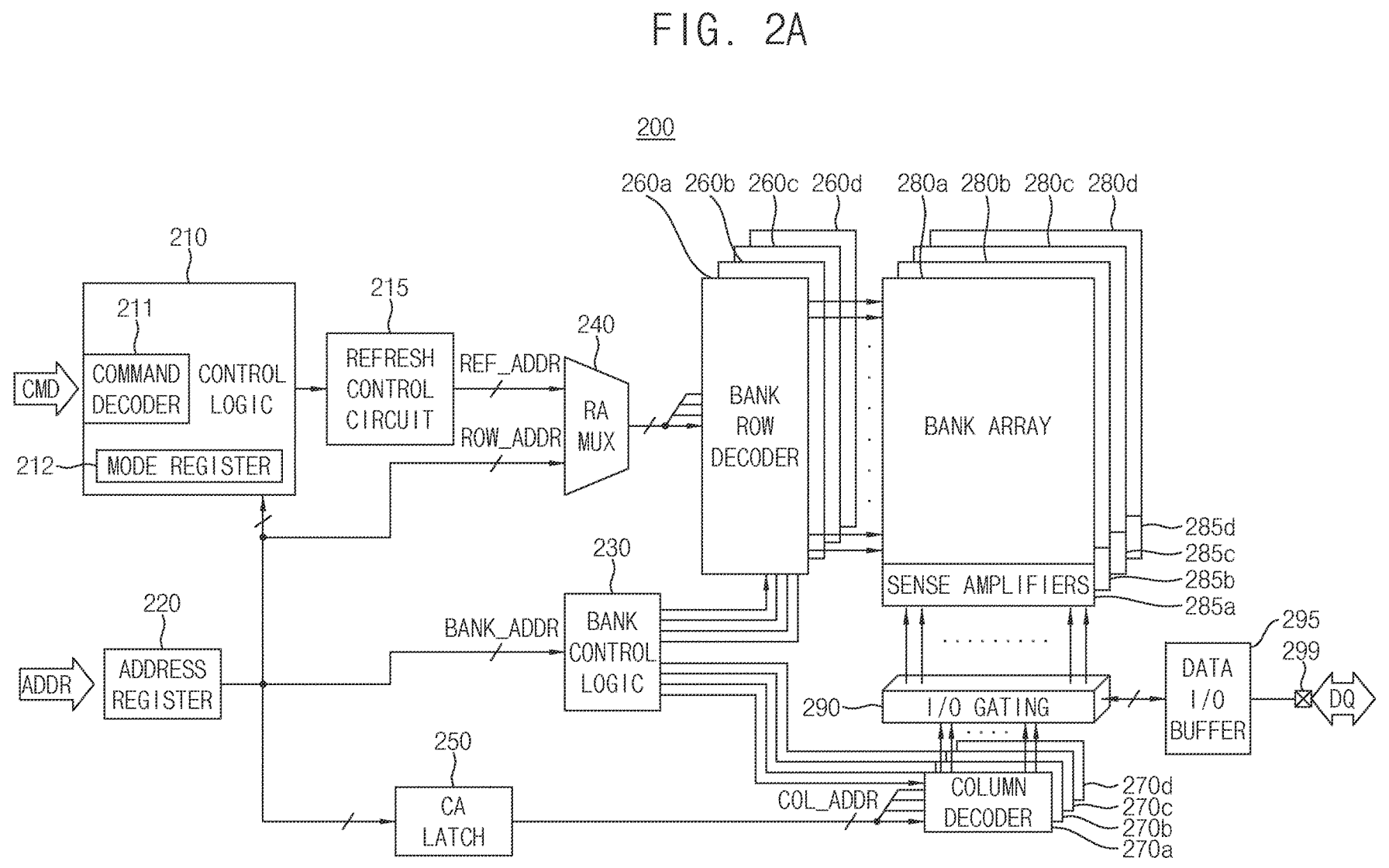

CMD

210

211 — COMMAND DECODER

CONTROL LOGIC

212 — MODE REGISTER

215 — REFRESH CONTROL CIRCUIT

REF_ADDR

ROW_ADDR

240 — RA MUX

BANK ROW DECODER 260a 260b 260c 260d 280a 280b 280c 280d

BANK ARRAY 285d 285c 285b 285a

SENSE AMPLIFIERS

290 — I/O GATING

295 — DATA I/O BUFFER

299

DQ 270d 270c 270b 270a

COLUMN DECODER

COL_ADDR

230 — BANK CONTROL LOGIC

BANK_ADDR

250 — CA LATCH

220 — ADDRESS REGISTER

ADDR

| DATA | ORIGINAL ADDRESS | MIGRATED ADDRESS |
|------|------------------|-------------------|
| DATa | ADDRa | ADDRb |
| ⋮ | ⋮ | ⋮ |

MEMORY EXPANDER AND COMPUTING SYSTEM INCLUDING THE SAME

CROSS-REFERENCE TO RELATED APPLICATION

This application claims priority under 35 USC § 119 to Korean Patent Application No. 10-2022-0180229 filed on Dec. 21, 2022 in the Korean Intellectual Property Office (KIPO), the contents of which are herein incorporated by reference in their entirety.

BACKGROUND

Example embodiments relate generally to semiconductor integrated circuits, and more particularly to memory expanders and computing systems including the memory expanders.

Computing systems may provide various information technology (IT) services to users. As various IT services are provided to the user, the amount of data that are processed by the computing systems may increase. For this reason, there may be a need to improve a speed at which data are processed. The computing systems may develop into heterogeneous computing environments to provide various IT services. Nowadays, various technologies for processing data at a high speed within the computing systems and/or the heterogeneous computing environments are being developed.

SUMMARY

Some embodiments of the present disclosure may provide a memory expander with improved power management and power repair.

Some embodiments of the present disclosure may provide a computing system including the memory expander.

According to example embodiments, a memory expander comprising: a plurality of memory sub-modules; a plurality of power management integrated circuits that are configured to be electrically connected to the respective plurality of memory sub-modules to supply a plurality of powers to the plurality of memory sub-modules, respectively; a controller that is electrically connected to the plurality of memory sub-modules to control operations of the plurality of memory sub-modules and to check whether each of the plurality of memory sub-modules is in a normal status or an abnormal status; and a power controller that is configured to be electrically connected to the plurality of power management integrated circuits to control operations of the plurality of power management integrated circuits, wherein the plurality of power management integrated circuits include a first power management integrated circuit, the plurality of powers include a first power, and the plurality of memory sub-modules include a first memory sub-module, wherein the first power management integrated circuit is electrically connected to the first memory sub-module to control the first power that is supplied to the first memory sub-module, and wherein the power controller is configured to control the first power management integrated circuit to stop supplying the first power to the first memory sub-module when the first memory sub-module is in the abnormal status.

According to example embodiments, a computing system comprising: a host device; a memory device that is electrically connected to the host device through a first interface; and a first memory expander that is electrically connected to the host device through a second interface different from the first interface, wherein the first memory expander includes: a plurality of memory sub-modules; a plurality of power management integrated circuits that are electrically connected to the respective plurality of memory sub-modules to supply a plurality of powers to the plurality of memory sub-modules, respectively; a controller that is electrically connected to the host device through the second interface to control operations of the plurality of memory sub-modules and to check whether each of the plurality of memory sub-modules is in a normal status or an abnormal status; and a power controller that is electrically connected to the plurality of power management integrated circuits, wherein the plurality of power management integrated circuits include a first power management integrated circuit, the plurality of powers include a first power, and the plurality of memory sub-modules include a first memory sub-module, wherein the first power management integrated circuit is electrically connected to the first memory sub-module to control the first power that is supplied to the first memory sub-module, and wherein the power controller is configured to control the first power management integrated circuit to stop supplying the first power when the first memory sub-module is in the abnormal status. According to example embodiments, a memory expander operating method comprising: detecting an abnormal status of a first memory sub-module among a plurality of memory sub-modules; copying data stored in the first memory sub-module to a second memory sub-module among the plurality of memory sub-modules; blocking a first power supplied to the first memory sub-module by controlling a first power management integrated circuit among a plurality of power management integrated circuits after the copying the data to the second memory sub-module, wherein the plurality of power management integrated circuits are electrically connected to the respective plurality of memory sub-modules; continuing operation of the second memory sub-module while the first power is blocked; replacing the first memory sub-module with a new normal memory sub-module after the blocking the first power; supplying the first power to the new normal memory sub-module by controlling the first power management integrated circuit after the replacing the first memory sub-module with the new normal memory sub-module; and copying the data copied in the second memory sub-module to the new normal memory sub-module after the supplying the first power to the new normal memory sub-module. The memory expander and the computing system according to example embodiments may include the power controller and the plurality of power management integrated circuits. The plurality of power management integrated circuits may independently and/or individually supply the plurality of powers to the plurality of memory sub-modules, and the power controller may control the operations of the plurality of power management integrated circuits. When the abnormality (e.g., defect or failure) has occurred in the specific memory sub-module, only the abnormal memory sub-module may be powered off and replaced with the normal memory sub-module, rather than the entire memory expander being replaced with a normal memory expander. In addition, the remaining memory sub-modules may normally operate during such replacement process. Accordingly, the efficient power management and power repair may be performed, and the performance degradation of the computing system including the memory expander may be limited.

BRIEF DESCRIPTION OF THE DRAWINGS

Illustrative, non-limiting example embodiments will be more clearly understood from the following detailed description taken in conjunction with the accompanying drawings.

FIGS. 2A and 2B are block diagrams illustrating examples of a memory included in a memory expander according to example embodiments.

FIGS. 8A, 8B and 8C are diagrams for describing an operation of FIG. 7.

FIGS. 13 and 14 are block diagrams illustrating a computing system including a memory expander according to example embodiments.

Figure 15:
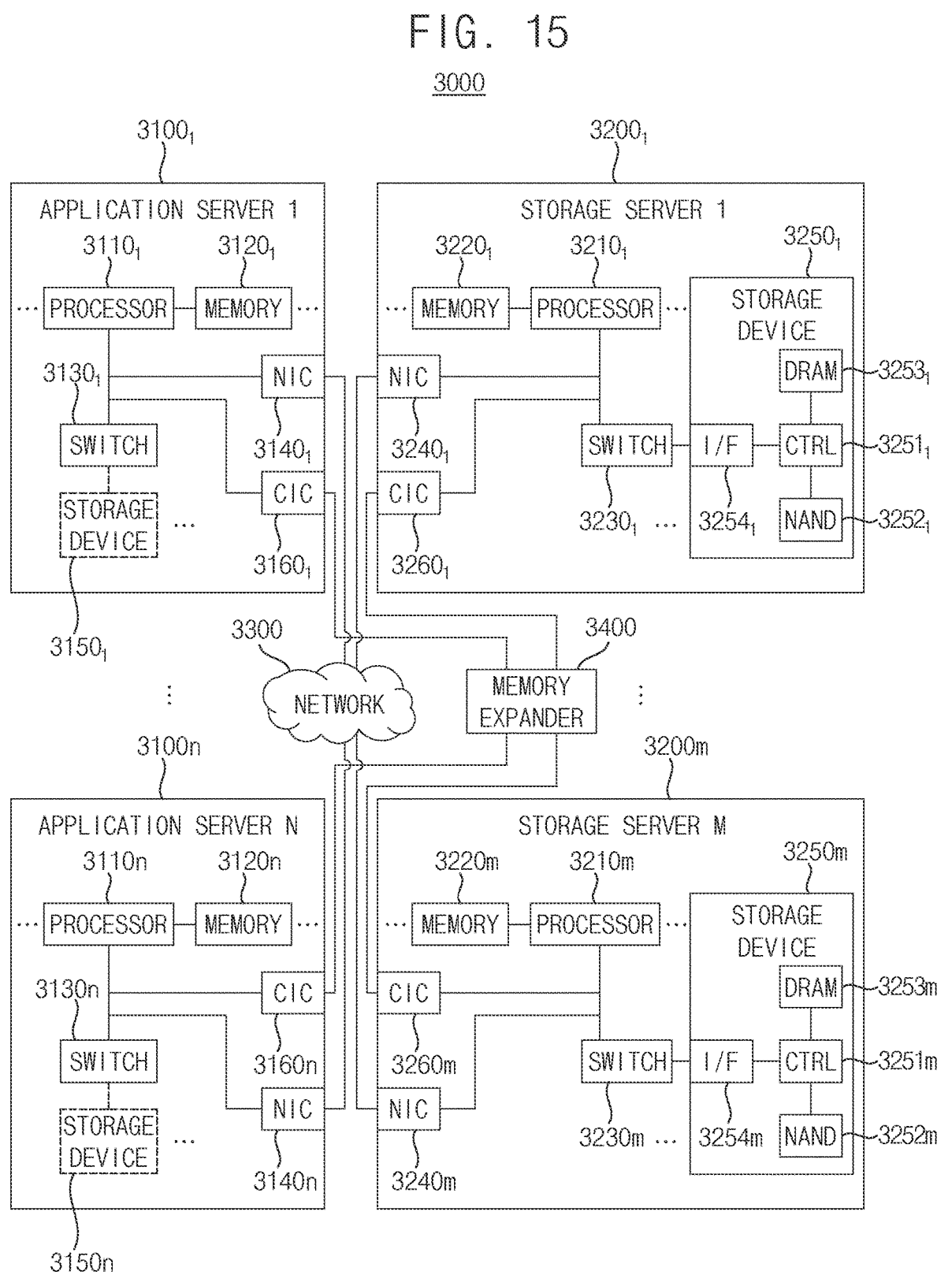

FIG. 15 is a block diagram illustrating a data center including a memory expander according to example embodiments.

DETAILED DESCRIPTION OF THE EMBODIMENTS

Figure 1:
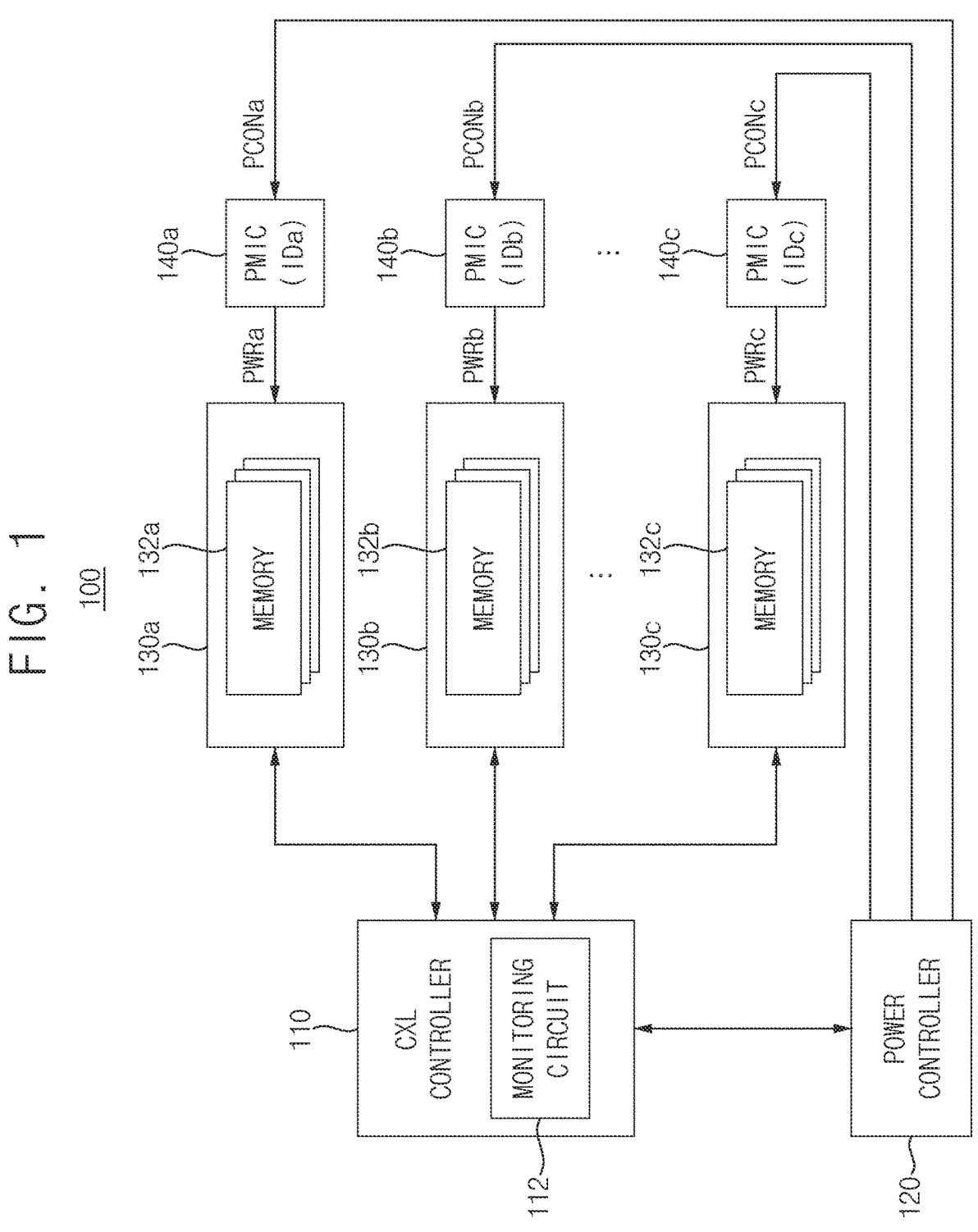
FIG. 1 is a block diagram illustrating a memory expander according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a memory expander according to example embodiments.

Referring to FIG. 1, a memory expander 100 includes a controller 110, a power controller 120, a plurality of memory sub-modules 130a, 130b, . . . , 130c, and a plurality of power management integrated circuits (PMICs) 140a, 140b, . . . , 140c. Although the number of the plurality of memory sub-modules 130a to 130c and the number of the plurality of PMICs 140a to 140c are described as three, respectively, the embodiments of the present disclosure are not limited thereto. For example, the plurality of memory sub-modules 130a to 130c may include more or less than three sub-modules. For example, the plurality of PMICs 140a to 140c may include more or less than three PMICs. The number of the plurality of memory sub-modules 130a to 130c may be equal to the number of the plurality of PMICs 140a to 140c.

The memory expander 100 may be included in a computing system that includes a host device (e.g., a central processing unit (CPU), etc.). The memory expander 100 may operate under the control of the host device, and may store data. The memory expander 100 may communicate with the host device through an interface different from that of a conventional memory device (e.g., a dynamic random access memory (DRAM) device), and may be electrically connected to the host device without adding memory channels to the host device. Thus, the memory expander 100 may be additionally installed in the computing system regardless of existing or conventional memory technologies, and the memory capacity and the memory bandwidth of the computing system may efficiently increase. The computing system including the memory expander 100 will be described with reference to FIG. 10 through 14.

The controller 110 may control overall operations of the memory expander 100, and may control operations of the plurality of memory sub-modules 130a to 130c. An example of the controller 110 will be described with reference to FIG. 3.

For example, based on requests (e.g., write requests and/or read requests) received from the host device, the controller 110 may control the operations (e.g., write operations and/or read operations) of the memory expander 100 and may control operations of exchanging data (e.g., receiving/storing write data and/or transmitting read data) between the host device and the memory expander 100. For example, the controller 110 may generate commands (e.g., write commands and/or read commands) for controlling operations (e.g., program operations and/or read operations) of the plurality of memory sub-modules 130a to 130c, may transmit the commands to the plurality of memory sub-modules 130a to 130c, and may control operations of exchanging data (e.g., transmitting/storing write data and/or receiving read data) with the plurality of memory sub-modules 130a to 130c.

The controller 110 may communicate with an external device (e.g., the host device) located outside the memory expander 100 through an interface based on a compute express link (CXL) protocol (CXL protocol-based interface). The interface based on the CXL protocol may be referred to as a CXL interface, and the controller 110 may be referred to as a CXL controller.

The CXL protocol is an open standard for high-speed CPU-to-device and CPU-to-memory connections, designed for, for example, high performance data center computers. The CXL protocol may be built on, for example, a peripheral component interconnect express (PCIe) to form a physical and electrical interface in several areas such as input/output (I/O), memory, and cache. The CXL protocol may maintain memory coherency between the CPU memory (e.g., a DRAM) directly attached to the CPU and the memory on the CXL device (e.g., a memory expander). For example, the CPU and the CXL device may access (e.g., read, write, and/or transfer) the same data seamlessly. For example, when the CXL protocol is applied or employed, the CPU may use both the CPU memory and the CXL device as a buffer memory.

Hereinafter, example embodiments will be described based on that a communication between the host device and the memory expander 100 is performed using the CXL interface, but example embodiments are not limited thereto. For example, the communication between the host device and the memory expander 100 may be performed using an interface implemented based on at least one of various protocols, such as a Gen-Z protocol, an NVLink protocol, a cache coherent interconnect for accelerators (CCIX) protocol, an open coherent accelerator processor interface (CAPI) protocol, etc.

The controller 110 may check whether the plurality of memory sub-modules 130a to 130c are abnormal (e.g., whether each of the plurality of memory sub-modules 130a to 130c has an abnormal state). For example, the controller 110 may include a monitoring circuit 112. The monitoring circuit 112 may check whether defects (or failures) have occurred in the plurality of memory sub-modules 130a to 130c by monitoring a plurality of accesses from the external device (e.g., from the host device) to the plurality of memory sub-modules 130a to 130c. For example, the monitoring circuit 112 may further check whether the plurality of memory sub-modules 130a to 130c are mounted normally and electrically connected normally. A detailed operation of the monitoring circuit 112 will be described later.

The plurality of memory sub-modules 130a to 130c may be controlled by the controller 110, and may store a plurality of data. Each of the plurality of memory sub-modules 130a to 130c may include one or more memories. For example, the memory sub-module 130a may include one or more memories 132a, the memory sub-module 130b may include one or more memories 132b, and the memory sub-module 130c may include one or more memories 132c. The plurality of memory sub-modules 130a to 130c may communicate with the controller 110 through independent channels, and those independent channels may be referred to as a memory channel, a media channel, etc. Each of the plurality of memory sub-modules 130a to 130c may communicate with the controller 110 through one of the independent channels.

In some example embodiments, each of the memories 132a to 132c may be or may include a volatile memory such as a DRAM, but is not limited thereto. In some example embodiments, each of the memories 132a to 132c may be or may include a nonvolatile memory such as a flash memory, but is not limited thereto. An example of the memories 132a to 132c will be described with reference to FIGS. 2A and 2B.

In some example embodiments, each of the plurality of memory sub-modules 130a to 130c may be attached to and detached from the memory expander 100, which will be described with reference to FIG. 4.

The plurality of power management integrated circuits 140a to 140c may independently and/or individually supply a plurality of powers (e.g., power supply voltages) PWRa, PWRb, . . . , PWRc to the plurality of memory sub-modules 130a to 130c. For example, the power management integrated circuit 140a may supply the power PWRa (e.g., only) to the memory sub-module 130a, the power management integrated circuit 140b may supply the power PWRb (e.g., only) to the memory sub-module 130b, and the power management integrated circuit 140c may supply the power PWRc (e.g., only) to the memory sub-module 130c. The number of the plurality of powers PWRa to PWRc are not limited to three. For example, the number of the plurality of powers PWRa to PWRc may be equal to the number of the plurality of power management integrated circuits 140a to 140c. For example, each of the plurality of power management integrated circuits 140a to 140c may include a voltage converter, a voltage regulator, etc.

The power controller 120 may communicate with the controller 110, and may control operations of the plurality of power management integrated circuits 140a to 140c. For example, the power controller 120 may generate a power control signal PCONa for controlling the operation of the power management integrated circuit 140a, may generate a power control signal PCONb for controlling the operation of the power management integrated circuit 140b, and may generate a power control signal PCONc for controlling the operation of the power management integrated circuit 140c.

In some example embodiments, a plurality of identifications (IDs) IDa, IDb, . . . , IDc may be assigned or allocated to the plurality of power management integrated circuits 140a to 140c. For example, the identification IDa may be assigned to the power management integrated circuit 140a, the identification IDb may be assigned to the power management integrated circuit 140b, and the identification IDc may be assigned to the power management integrated circuit 140c. The power controller 120 may independently control the plurality of power management integrated circuits 140a to 140c using the plurality of identifications IDa to IDc. The number of the plurality of identifications IDa to IDc are not limited to three. For example, the number of the plurality of identifications IDa to IDc may be equal to the number of the plurality of power management integrated circuits 140a to 140c.

In some example embodiments, as the plurality of powers PWRa to PWRc are independently and/or individually supplied to the plurality of memory sub-modules 130a to 130c, the plurality of memory sub-modules 130a to 130c may be included in different power domains or different voltage domains. The power controller 120 may control a power-up sequence and/or a power-down sequence associated with or related to each power domain of each memory sub-module.

In some example embodiments, the communication between the power controller 120 and the plurality of power management integrated circuits 140a to 140c may be performed based on an inter-integrated circuits (I2C) interface or an improved inter-integrated circuits (I3C) interface, but is not limited thereto.

When a specific memory sub-module (e.g., the memory sub-module 130a) among the plurality of memory sub-modules 130a to 130c becomes abnormal, e.g., when a defect, failure, or error has occurred in the specific memory sub-module, the power controller 120 may control a specific (e.g., corresponding) power management integrated circuit (e.g., the power management integrated circuit 140a), which supplies a power (e.g., the power PWRa) to the specific memory sub-module, among the plurality of power management integrated circuits 140a to 140c to block or cut off the power supplied to the specific memory sub-module. Such power-blocking operation will be described with reference to FIGS. 5 and 6A.

In some example embodiments, as will be described with reference to FIGS. 5, 6B, 6C and 6D, the abnormal memory sub-module or faulty memory sub-module (e.g., the specific memory sub-module in which the defect, failure, or error has occurred) may be replaced with a normal memory sub-module. The replaced memory sub-module may be a newly implemented normal memory sub-module and may not be the pre-existing normal memory sub-modules (e.g., memory sub-module 130b or memory sub-module 130c). For example, when the memory sub-module 130a is an abnormal memory sub-module, the memory sub-module 130a may not be replaced by the pre-existing normal memory sub-modules 130b and 130c among the plurality of memory sub-modules 130a to 130c. The memory sub-module 130a may be configured to be electrically disconnected from the memory expander 100.

In some example embodiments, as will be described with reference to FIGS. 7, 8A, 8B, and 8C, a migration operation in which data stored in the abnormal memory sub-module (e.g., memory sub-module 130a) is copied to a pre-existing normal memory sub-module (e.g., memory sub-module 130b and/or memory sub-module 130c) may be performed. In addition, after the abnormal memory sub-module is replaced with the normal memory sub-module, a re-migration operation in which the data copied to and stored in the pre-existing normal memory sub-module is re-copied to the replaced memory sub-module may be performed.

The memory expander 100 according to example embodiments may include the power controller 120 and the plurality of power management integrated circuits 140a to 140c. The plurality of power management integrated circuits 140a to 140c may independently and/or individually supply the plurality of powers PWRa to PWRc to the plurality of memory sub-modules 130a to 130c, and the power controller 120 may control the operations of the plurality of power management integrated circuits 140a to 140c. When the abnormality (e.g., defect or failure) has occurred in the specific memory sub-module (e.g., memory sub-module 130a), only the abnormal memory sub-module may be powered off and replaced with the normal memory sub-module, rather than the entire memory expander 100 is replaced with a normal memory expander. In addition, the remaining memory sub-modules (e.g., memory sub-modules 130b and 130c) may normally operate during such replacement process. Accordingly, the efficient power management and power repair may be performed, and the performance degradation of a system including the memory expander 100 may be reduced.

Figure 2B:
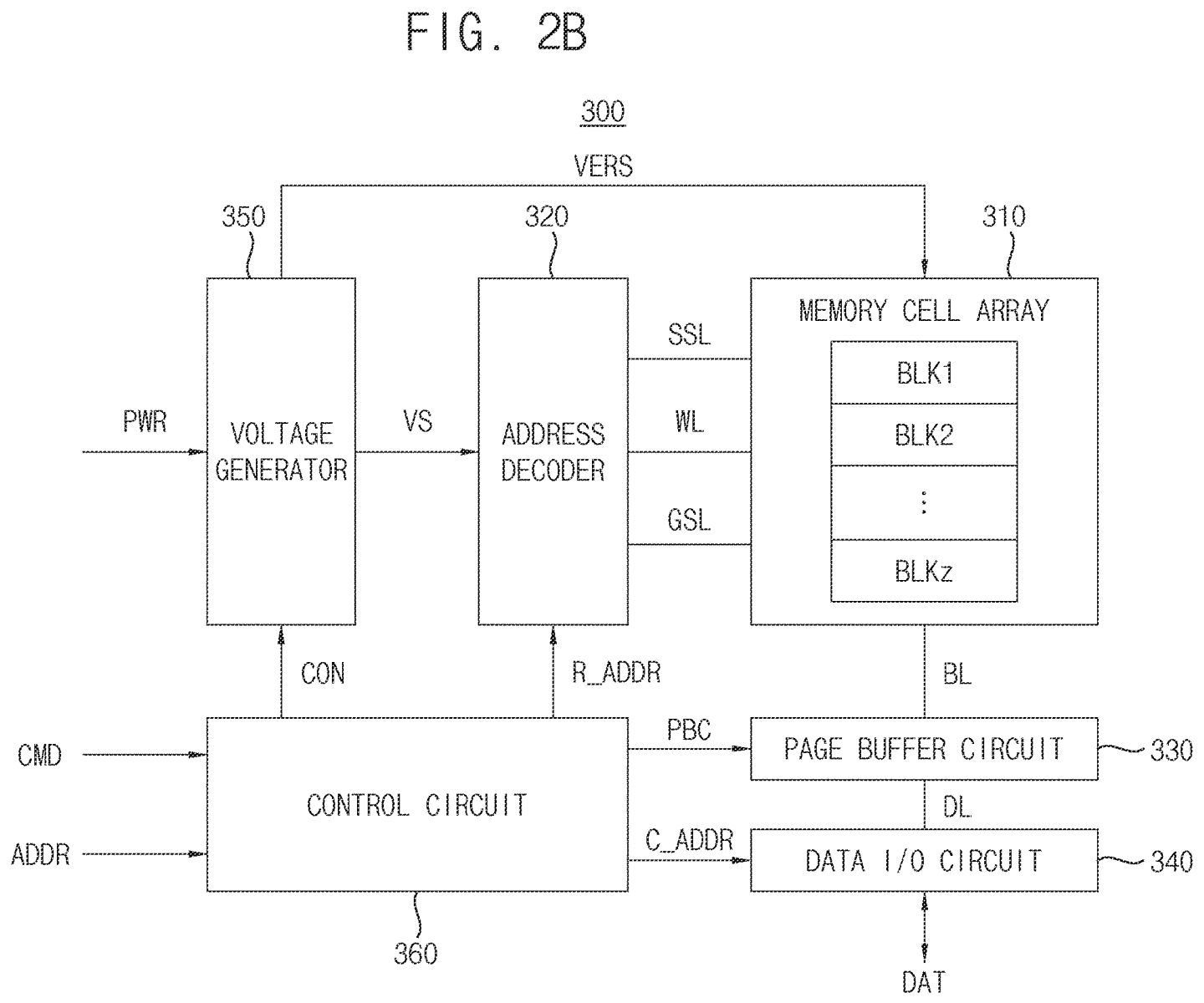

FIGS. 2A and 2B are block diagrams illustrating examples of a memory included in a memory expander according to example embodiments.

Referring to FIG. 2A, a memory 200 includes a control logic 210, a refresh control circuit 215, an address register 220, a bank control logic 230, a row address multiplexer 240, a column address latch 250, a row decoder, a column decoder, a memory cell array, a sense amplifier unit, an input/output (I/O) gating circuit 290, a data I/O buffer 295 and a data I/O pad 299. For example, the memory 200 may be one of various volatile memories such as a DRAM.

The memory cell array may include a plurality of memory cells. The memory cell array may include a plurality of bank arrays, e.g., first to fourth bank arrays 280a, 280b, 280c, and 280d. The row decoder may include a plurality of bank row decoders, e.g., first to fourth bank row decoders 260a, 260b, 260c, and 260d electrically connected to the first to fourth bank arrays 280a, 280b, 280c, and 280d, respectively. The column decoder may include a plurality of bank column decoders, e.g., first to fourth bank column decoders 270a, 270b, 270c, and 270d electrically connected to the first to fourth bank arrays 280a, 280b, 280c, and 280d, respectively. The sense amplifier unit may include a plurality of bank sense amplifiers, e.g., first to fourth bank sense amplifiers 285a, 285b, 285c, and 285d electrically connected to the first to fourth bank arrays 280a, 280b, 280c, and 280d, respectively. The numbers of the plurality of bank arrays, the plurality of bank decoders, the plurality of column decoders, and the plurality of sense amplifiers are described as four, respectively, but the embodiments of the present disclosure are not limited thereto. For example, the numbers of the plurality of bank arrays, the plurality of bank decoders, the plurality of column decoders, and the plurality of sense amplifiers may be more or less than four. The numbers of the plurality of bank arrays, the plurality of bank decoders, the plurality of column decoders, and the plurality of sense amplifiers may be equal.

The first to fourth bank arrays 280a to 280d, the first to fourth bank row decoders 260a to 260d, the first to fourth bank column decoders 270a to 270d, and the first to fourth bank sense amplifiers 285a to 285d may form first to fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank.

The address register 220 may receive an address ADDR including a bank address BANK_ADDR, a row address ROW_ADDR, and a column address COL_ADDR from a controller (e.g., from the controller 110 in FIG. 1) located outside the memory 200. The address register 220 may provide the received bank address BANK_ADDR to the bank control logic 230, may provide the received row address ROW_ADDR to the row address multiplexer 240, and may provide the received column address COL_ADDR to the column address latch 250. As used hereinafter, the terms "external/outside device", "external/outside signal", or "outside" are intended to broadly refer to a device, circuit, block, module and/or signal that resides externally (i.e., outside of a functional or physical boundary) with respect to a given circuit, block, module, or device.

The bank control logic 230 may generate bank control signals in response to receipt of the bank address BANK_ADDR. One of the first to fourth bank row decoders 260a to 260d corresponding to the received bank address BANK_ADDR may be activated in response to the bank control signals generated by the bank control logic 230, and one of the first to fourth bank column decoders 270a to 270d corresponding to the received bank address BANK_ADDR may be activated in response to the bank control signals generated by the bank control logic 230.

The refresh control circuit 215 may generate a refresh address REF_ADDR in response to receipt of a refresh command or entrance of any self-refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output (e.g., the row address ROW_ADDR or the refresh address REF_ADDR) from the row address multiplexer 240 may be applied to the first to fourth bank row decoders 260a to 260d.

The activated one of the first to fourth bank row decoders 260a to 260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to the first to fourth bank column decoders 270a to 270d.

The activated one of the first to fourth bank column decoders 270a to 270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, although not shown, the I/O gating circuit 290 may include an input data mask logic, read data latches for storing data output from the first to fourth bank arrays 280a to 280d, and write drivers for writing data to the first to fourth bank arrays 280a to 280d.

Data DQ to be read from one of the first to fourth bank arrays 280a to 280d may be sensed by a sense amplifier electrically connected thereto, and may be stored in the read data latches. The data DQ stored in the read data latches may be provided to the controller (e.g., the controller 110 in FIG. 1) via the data I/O buffer 295 and the data I/O pad 299. Data DQ received via the data I/O pad 299 that are to be written to one of the first to fourth bank arrays 280a to 280d may be provided from the controller (e.g., the controller 110 in FIG. 1) to the data I/O buffer 295. The data DQ received via the data I/O pad 299 and provided to the data I/O buffer 295 may be written to one of the first to fourth bank arrays 280a to 280d via the write drivers in the I/O gating circuit 290.

The control logic 210 may control an operation of the memory 200. For example, the control logic 210 may generate control signals for the memory 200 to perform a data write operation or a data read operation. The control logic 210 may include a command decoder 211 that decodes a command CMD received from the controller (e.g., the controller 110 in FIG. 1) and a mode register 212 that sets an operation mode of the memory 200.

Referring to FIG. 2B, a memory 300 may include a memory cell array 310, an address decoder 320, a page buffer circuit 330, a data input/output (I/O) circuit 340, a voltage generator 350, and a control circuit 360. For example, the memory 300 may be one of various nonvolatile memories such as a NAND flash memory, but is not limited thereto.

The memory cell array 310 may be electrically connected to the address decoder 320 via a plurality of string selection lines SSL, a plurality of wordlines WL, and a plurality of ground selection lines GSL. The memory cell array 310 may be further electrically connected to the page buffer circuit 330 via a plurality of bitlines BL. The memory cell array 310 may include a plurality of memory cells (e.g., a plurality of nonvolatile memory cells) that are electrically connected to the plurality of wordlines WL and the plurality of bitlines BL. The memory cell array 310 may be divided into a plurality of memory blocks BLK1, BLK2, . . . , BLKz each of which includes memory cells.

In some example embodiments, the plurality of memory cells may be arranged in a two-dimensional (2D) array structure or a three-dimensional (3D) vertical array structure. A three-dimensional vertical array structure may include vertical cell strings that are vertically oriented such that at least one memory cell is located over another memory cell. The at least one memory cell may comprise a charge trap layer, but is not limited thereto. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654, 587; 8,559,235; and US Pat. Pub. No. 2011/0233648. However, the embodiments of the present disclosure are not limited to those patent documents.

The control circuit 360 may receive a command CMD and an address ADDR from a controller (e.g., from the controller 110 in FIG. 1) located outside the memory 300, and may control erasure, programming and read operations of the memory 300 based on the command CMD and the address ADDR. An erasure operation may include performing a sequence of erase loops, and a programming operation may include performing a sequence of program loops. Each program loop may include a program operation and a program verification operation. Each erase loop may include an erase operation and an erase verification operation. The read operation may include a normal read operation and data recovery read operation.

For example, the control circuit 360 may generate control signals CON, which are used for controlling the voltage generator 350, and may generate control signal PBC for controlling the page buffer circuit 330, based on the command CMD, and may generate a row address R_ADDR and a column address C_ADDR based on the address ADDR. The control circuit 360 may provide the row address R_ADDR to the address decoder 320 and may provide the column address C_ADDR to the data I/O circuit 340.

The address decoder 320 may be electrically connected to the memory cell array 310 via the plurality of string selection lines SSL, the plurality of wordlines WL, and the plurality of ground selection lines GSL. For example, in the data erase/write/read operations, the address decoder 320 may determine at least one of the plurality of wordlines WL as a selected wordline, at least one of the plurality of string selection lines SSL as a selected string selection line, and at least one of the plurality of ground selection lines GSL as a selected ground selection line, based on the row address R_ADDR.

The voltage generator 350 may generate voltages VS that are required for an operation of the memory 300 based on a power PWR and the control signals CON. The voltages VS may be applied to the plurality of string selection lines SSL, the plurality of wordlines WL, and the plurality of ground selection lines GSL via the address decoder 320. In addition, the voltage generator 350 may generate an erase voltage VERS that is required for the erase operation based on the power PWR and the control signals CON.

The page buffer circuit 330 may be electrically connected to the memory cell array 310 via the plurality of bitlines BL. The page buffer circuit 330 may include a plurality of page buffers. The page buffer circuit 330 may store data DAT to be programmed into the memory cell array 310 or may read data DAT sensed from the memory cell array 310. In other words, the page buffer circuit 330 may operate as a write driver or a sensing amplifier according to an operation mode of the memory 300.

The data I/O circuit 340 may be electrically connected to the page buffer circuit 330 via data lines DL. The data I/O circuit 340 may provide the data DAT from the outside of the memory 300 to the memory cell array 310 via the page buffer circuit 330 or may provide the data DAT from the memory cell array 310 to the outside of the memory 300, based on the column address C_ADDR.

Although the memory included in the memory expander (e.g., memory expander 100 in FIG. 1) according to example embodiments is described based on a DRAM and a NAND flash memory, the memory according to example embodiments may be any volatile memory, and/or any nonvolatile memory, e.g., a static random access memory (SRAM), a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 3:
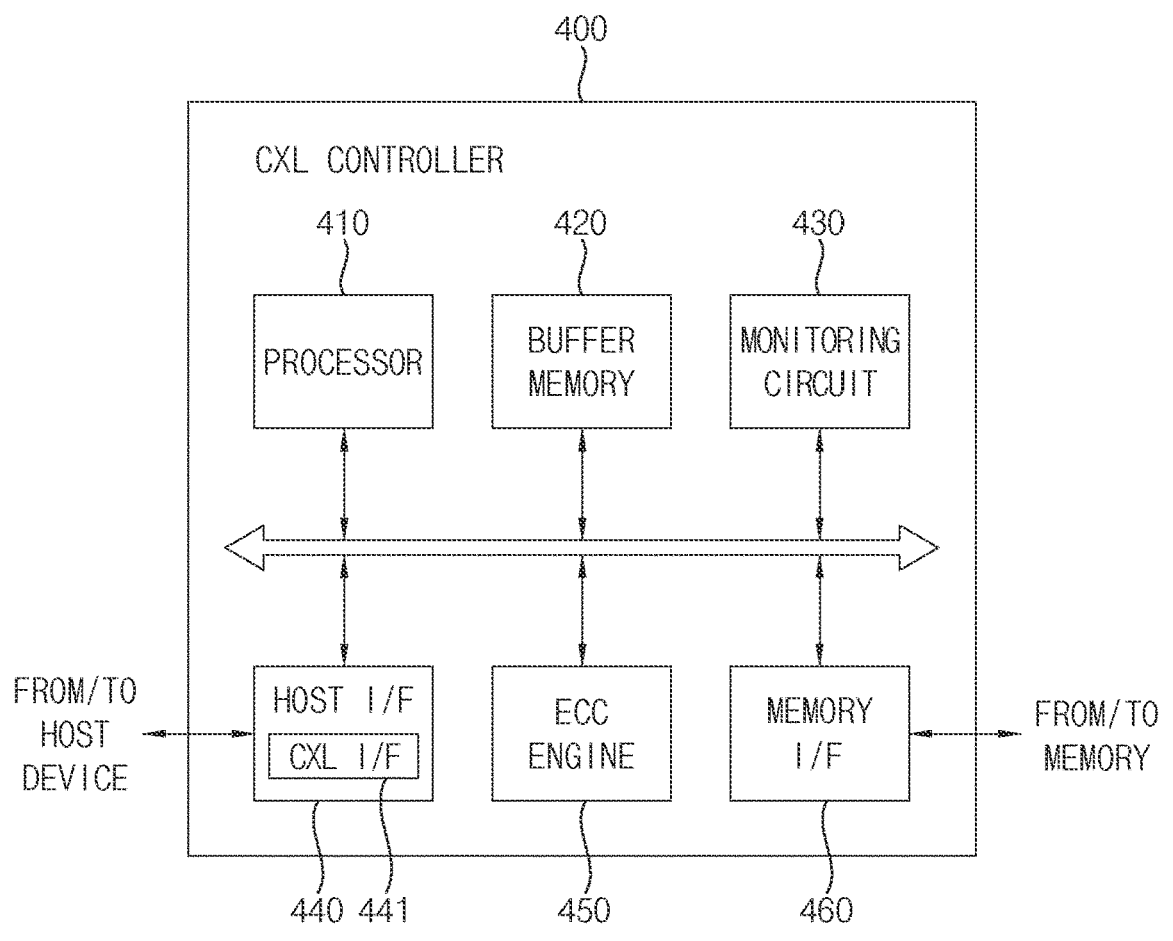
FIG. 3 is a block diagram illustrating an example of a controller included in a memory expander according to example embodiments.

FIG. 3 is a block diagram illustrating an example of a controller included in a memory expander according to example embodiments.

Referring to FIG. 3, a controller 400 may include a processor 410, a buffer memory 420, a monitoring circuit 430, a host interface (I/F) 440, an error correction code (ECC) engine 450 and a memory interface 460. The controller 400 may be a CXL controller. The controller 400 may be substantially the same as the controller 110 in FIG. 1.

The processor 410 may control an operation of the controller 400 in response to commands and/or requests received via the host interface 440 from a host device (e.g., a host device 510 in FIG. 10) located outside the controller 400. For example, the processor 410 may control an operation of a memory expander (e.g., the memory expander 100 in FIG. 1), and may control respective components by employing firmware for operating the memory expander.

The buffer memory 420 may store instructions and data executed and processed by the processor 410. For example, the buffer memory 420 may be implemented with a volatile memory such as a DRAM, a SRAM, a cache memory, etc.

The monitoring circuit 430 may be substantially the same as the monitoring circuit 112 in FIG. 1. For example, the monitoring circuit 430 may check whether defects (or failures) have occurred in a plurality of memory sub-modules (e.g., the plurality of memory sub-modules 130a to 130c in FIG. 1) included in the memory expander by monitoring a plurality of accesses to the plurality of memory sub-modules.

The ECC engine 450 for error correction may perform coded modulation by using, for example, a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc. or may perform ECC encoding and ECC decoding by using above-described example codes or other error correction codes.

The host interface 440 may provide physical connections between the host device and the controller 400. The host interface 440 may provide an interface corresponding to a bus format of the host device for communication between the host device and the controller 400. For example, the host interface 440 may provide an interface based on the PCIe protocol. For example, the host interface 440 may include a CXL interface 441 for supporting the CXL protocol.

The memory interface 460 may provide physical connections between the controller 400 and the plurality of memory sub-modules. For example, the memory interface 460 may exchange data with the plurality of memory sub-modules. For example, the memory interface 460 may transmit a command and an address to the plurality of memory sub-modules and may transmit data to the plurality of memory sub-modules or receive data read from the plurality of memory sub-modules. For example, the memory interface 460 may be configured to comply with a standard protocol, such as Toggle or open NAND flash interface (ONFI), but is not limited thereto.

Figure 4:
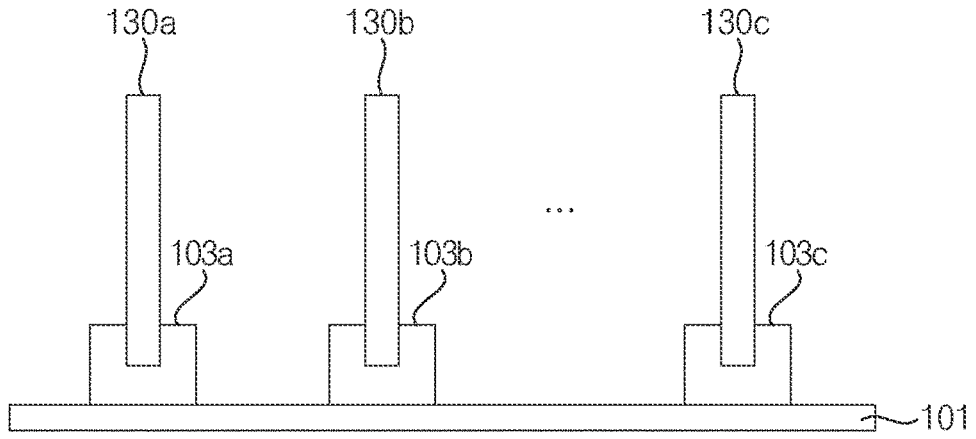
FIG. 4 is a diagram illustrating an example of arrangement and connection of memory sub-modules included in a memory expander according to example embodiments.

FIG. 4 is a diagram illustrating an example of arrangement and connection of memory sub-modules included in a memory expander according to example embodiments.

Referring to FIGS. 1 and 4, the memory expander 100 may further include a substrate 101, and a plurality of slots (or any other suitable structures such as sockets) 103a, 103b, . . . , 103c formed on the substrate 101. The number of the plurality of slots (or sockets) may be equal to the number of the plurality of memory sub-modules (e.g., the plurality of memory sub-modules 130a to 130c).

The plurality of memory sub-modules 130a to 130c may be electrically attachable to and detachable from the memory expander 100 using the plurality of slots 103a to 103c (or any other suitable structures such as sockets) into which the plurality of memory sub-modules 130a to 130c are connected (e.g., inserted). For example, the memory sub-module 130a including the one or more memories 132a may be inserted into the slot 103a and electrically attached to the memory expander 100 and may be removed from the slot 103a and electrically detached from the memory expander 100. Similarly, the memory sub-module 130b including the one or more memories 132b may be inserted into and removed from the slot 103b, and the memory sub-module 130c including the one or more memories 132c may be inserted into and removed from the slot 103c.

Figure 5:
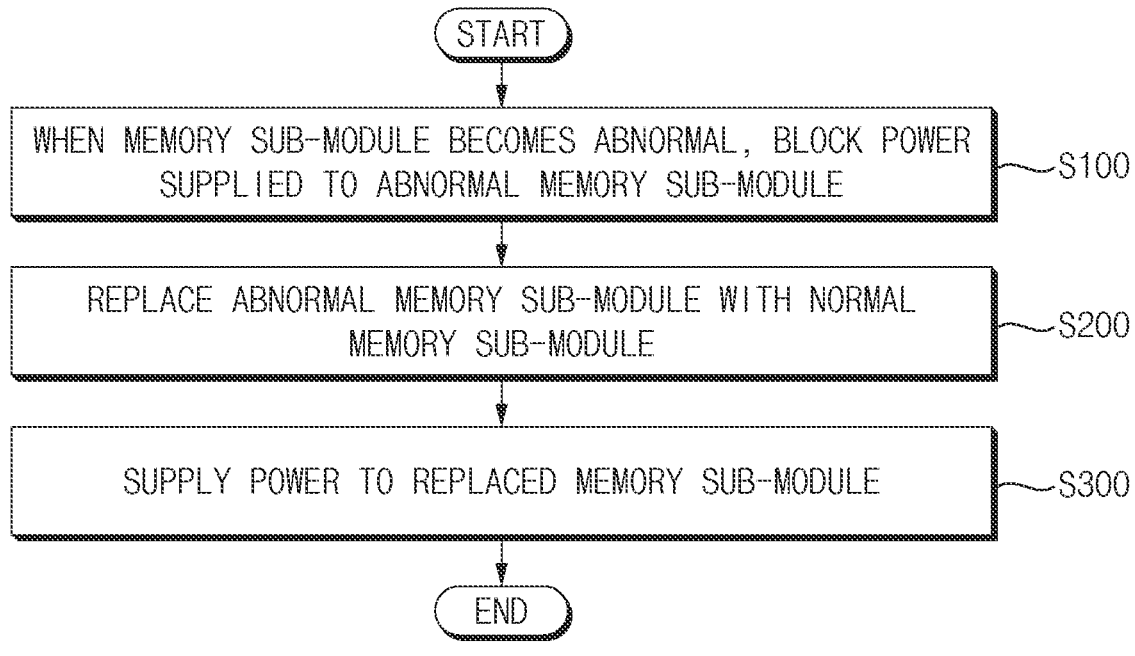
FIG. 5 is a flowchart illustrating a method of operating a memory expander according to example embodiments.

FIG. 5 is a flowchart illustrating a method of operating a memory expander according to example embodiments. FIGS. 6A, 6B, 6C, and 6D are diagrams for describing an operation of FIG. 5. A method of operating a memory expander according to example embodiments may be referred to as a method of repairing a memory expander.

Referring to FIGS. 5, 6A, 6B, 6C, and 6D, in a method of operating a memory expander according to example embodiments, when a specific memory sub-module among the plurality of memory sub-modules 130a to 130c becomes abnormal, e.g., when a defect or failure has occurred in the specific memory sub-module, a power supplied to the abnormal memory sub-module in which the defect has occurred may be blocked (operation S100). Operation S100 may be performed by the controller 110, the power controller 120, and the plurality of power management integrated circuits 140a to 140c.

Figure 6A:
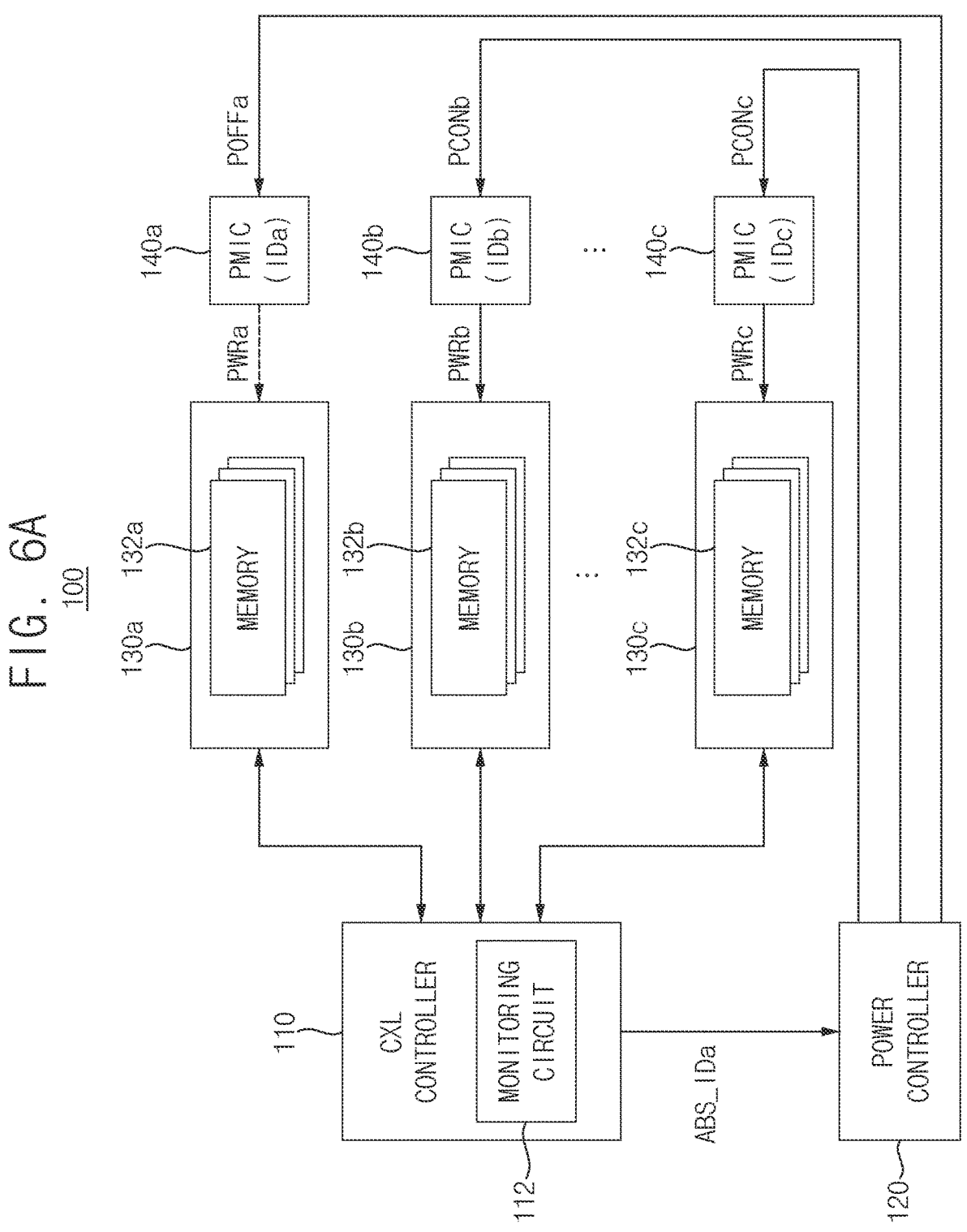
FIGS. 6A, 6B, 6C and 6D are diagrams for describing an operation of FIG. 5.

For example, as illustrated in FIG. 6A, the controller 110 and the monitoring circuit 112 included in the controller 110 may determine that the defect has occurred in the memory sub-module 130a among the plurality of memory sub-modules 130a to 130c, may generate an abnormality signal ABS_IDa representing or indicating that the defect has occurred in the memory sub-module 130a, and may provide the abnormality signal ABS_IDa to the power controller 120. For example, the abnormality signal ABS_IDa may include the identification IDa of the power management integrated circuit 140a to identify or specify the power management integrated circuit 140a that supplies the power PWRa to the memory sub-module 130a.

Based on the abnormality signal ABS_IDa, the power controller 120 may generate a power-off signal POFFa for controlling the power management integrated circuit 140a to block the power PWRa supplied to the memory sub-module 130a. For example, the power-off signal POFFa may be included in the power control signal PCONa in FIG. 1.

The power management integrated circuit 140a may block (e.g., stop supplying) the power PWRa supplied to the memory sub-module 130a based on the power-off signal POFFa. In FIG. 6A, an operation of blocking the supply of the power PWRa is illustrated by a dotted arrow. For example, the operation of blocking the supply of the power (e.g., PWRa) may refer to an operation of stop supplying the power hereinafter.

In some example embodiments, the controller 110 and the monitoring circuit 112 included in the controller 110 may check whether defects have occurred in the plurality of memory sub-modules 130a to 130c by monitoring a plurality of accesses to the plurality of memory sub-modules 130a to 130c. For example, the monitoring circuit 112 may check whether the defect has occurred in each of the plurality of memory sub-modules 130a to 130c based on a usage amount of each of the plurality of memory sub-modules 130a to 130c or based on whether read data retrieved from each of the plurality of memory sub-modules 130a to 130c includes an error.

For example, the monitoring circuit 112 may check whether the defect has occurred in the memory sub-module 130a by counting poisons generated in the read data obtained from the memory sub-module 130a. For example, when the number of the poisons exceeds a predetermined threshold number, it may be determined that the defect has occurred in the memory sub-module 130a. For example, when the read data includes an uncorrectable error (e.g., when an uncorrectable ECC (UECC)) occurs in the read data, it may be counted as an occurrence of the poison.

For example, the monitoring circuit 112 may check whether the defect has occurred in the memory sub-module 130a by detecting a viral state of the memory sub-module 130a. For example, when the viral state is detected on the memory sub-module 130a, it may be determined that the defect has occurred in the memory sub-module 130a. For example, when permanent damage occurs in the memory sub-module 130a, the viral state may be detected.

However, example embodiments are not limited thereto, and it may be checked whether the plurality of memory sub-modules 130a to 130c become abnormal using various parameters and/or schemes.

After the power supplied to the abnormal memory sub-module is blocked, the abnormal memory sub-module may be replaced with a normal memory sub-module (operation S200).

Figure 6B:
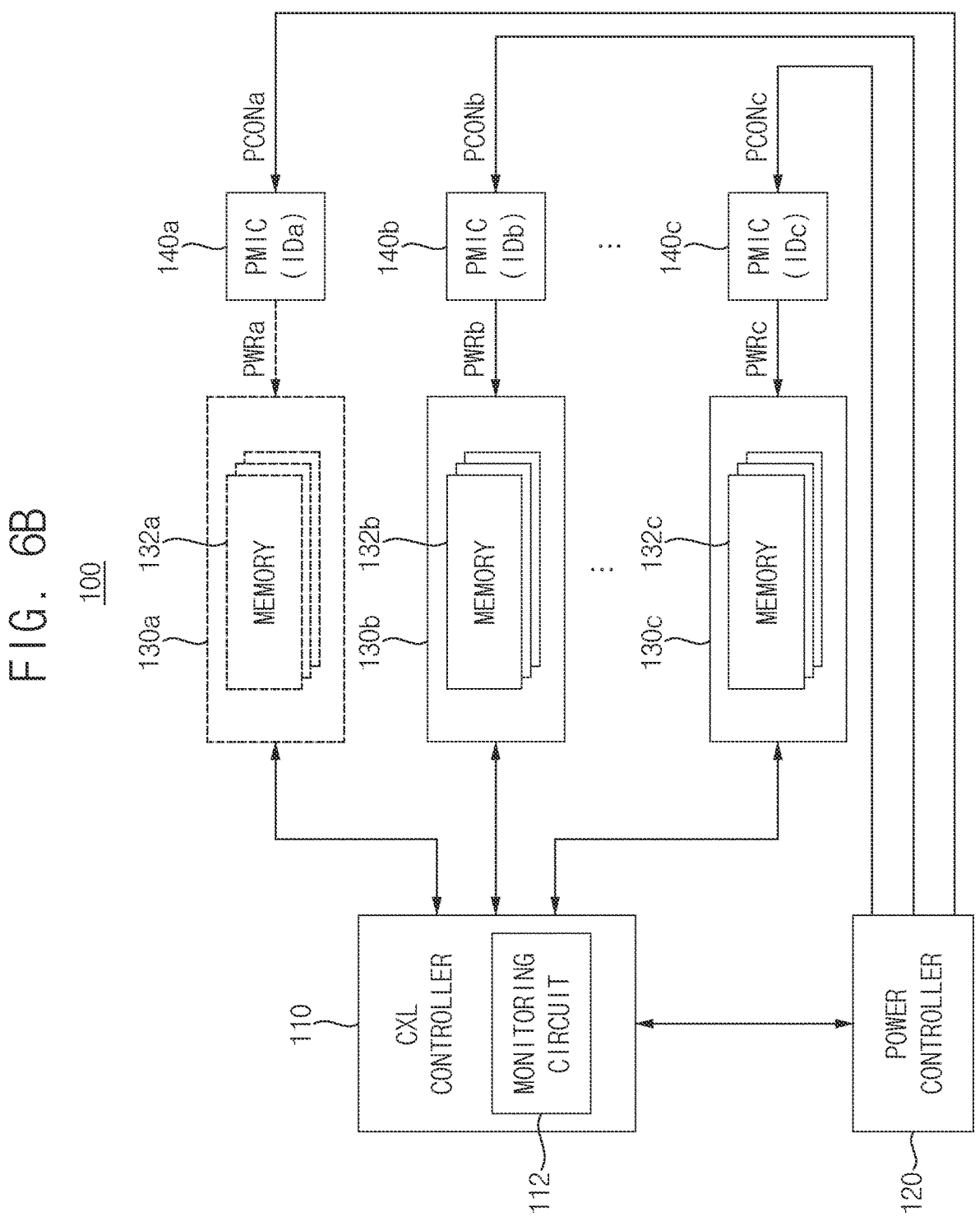

For example, as illustrated in FIG. 6B, the memory sub-module 130a in which the defect has occurred may be removed from the memory expander 100. For example, as described with reference to FIG. 4, the memory sub-module 130a mounted on the slot 103a may be removed from the slot 103a.

Figure 6C:
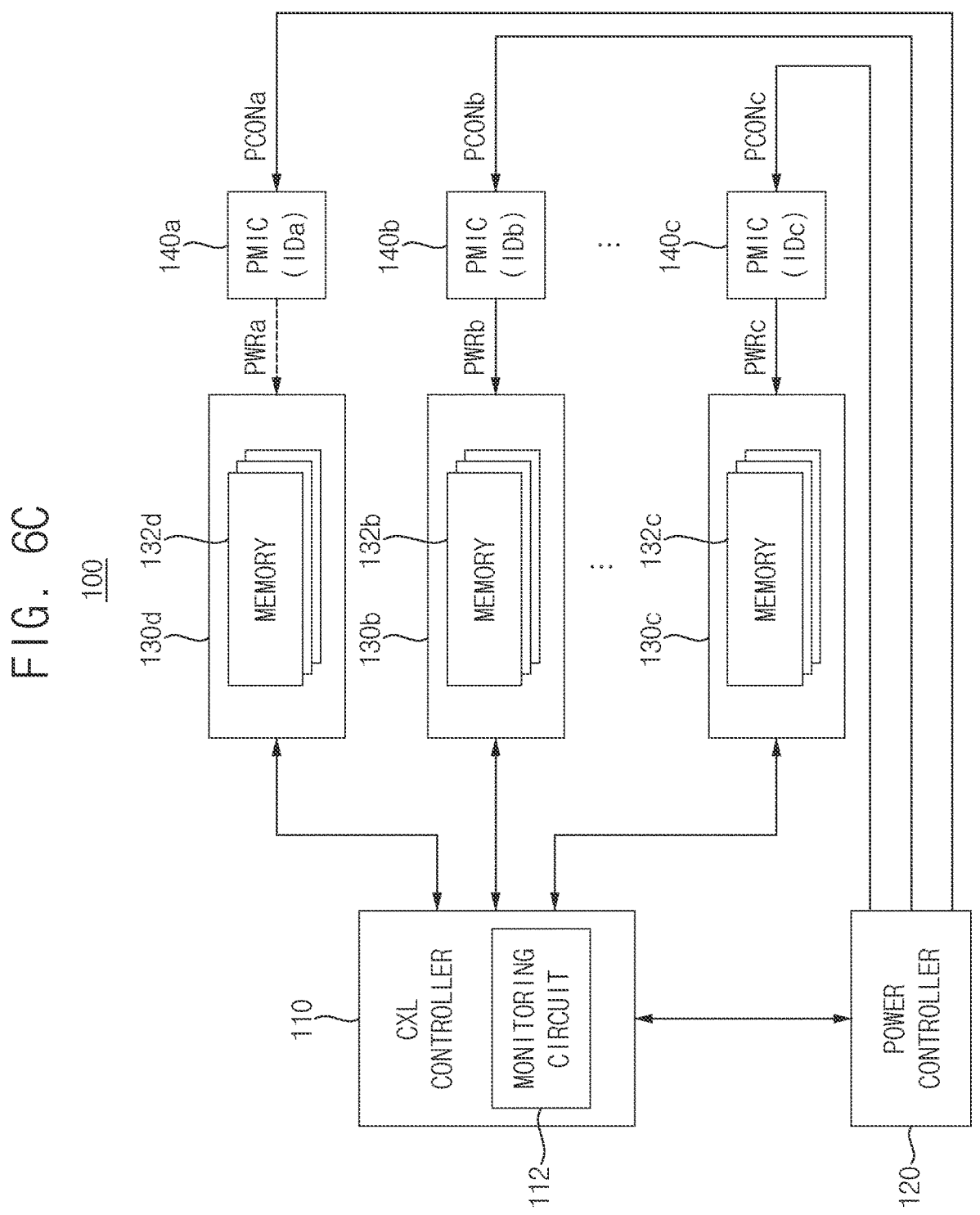

Thereafter, as illustrated in FIG. 6C, a memory sub-module 130d, which is a normal memory sub-module and includes one or more memories 132d, may be mounted on a position from which the memory sub-module 130a is removed. For example, as described with reference to FIG. 4, the memory sub-module 130d may be inserted into the slot 103a.

In some example embodiments, while the abnormal memory sub-module 130a is being replaced with the normal memory sub-module 130d as illustrated in S200 of FIG. 5 and FIGS. 6B and 6C, the remaining memory sub-modules 130b and 130c other than the abnormal memory sub-module 130a among the plurality of memory sub-modules 130a to 130c may be in operation. In some embodiments, the remaining memory sub-modules 130b and 130c may normally operate. For example, the remaining memory sub-modules 130b and 130c may normally receive the powers PWRb and PWRc from the power management integrated circuits 140b and 140c, and may normally perform write/read operations, and the controller 110 may normally exchange data with the host device using the remaining memory sub-modules 130b and 130c.

After the abnormal memory sub-module is replaced with the normal memory sub-module, a power may be supplied to the replaced memory sub-module (operation S300). Operation S300 may be performed by the controller 110, the power controller 120, and the plurality of power management integrated circuits 140a to 140c.

Figure 6D:
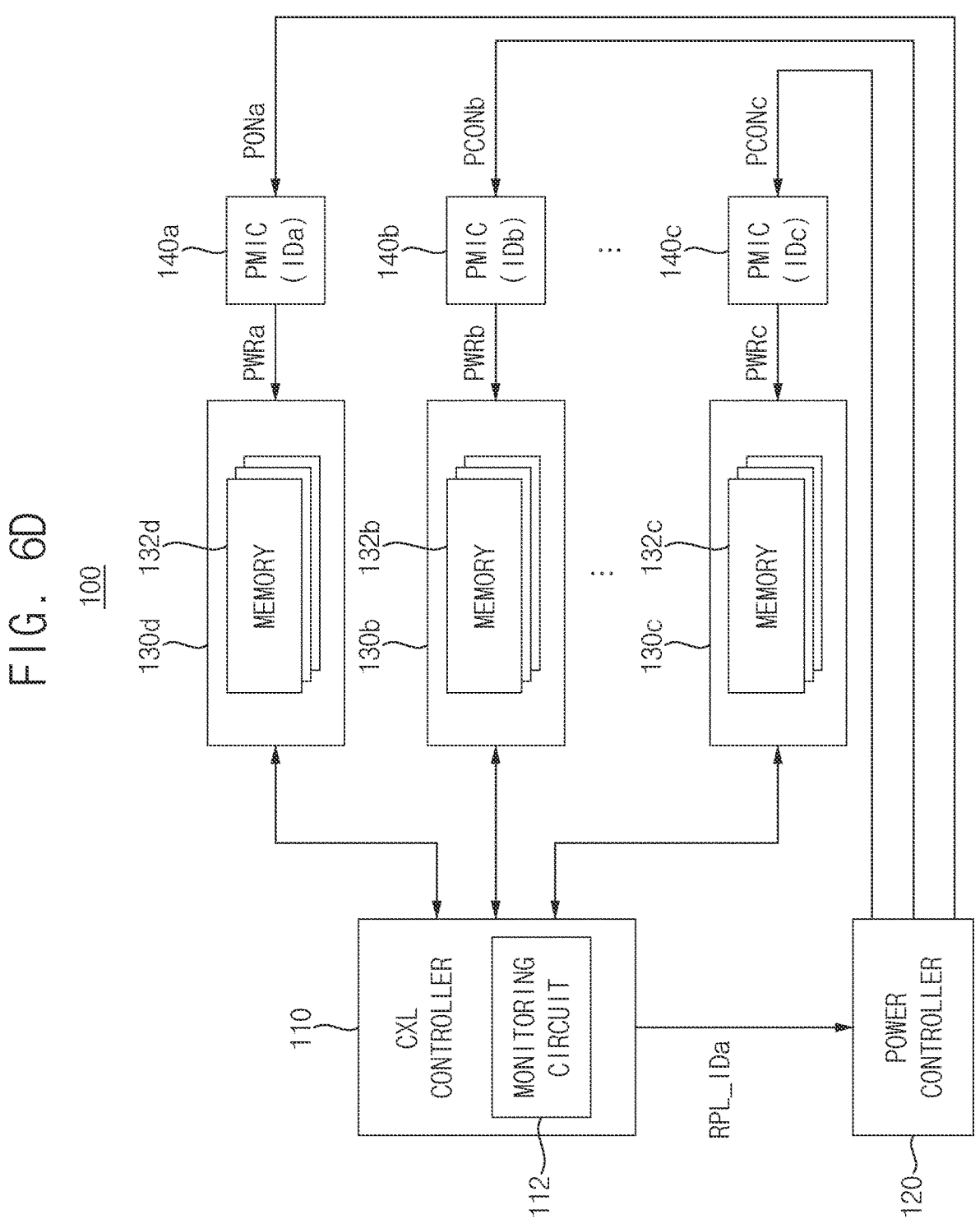

For example, as illustrated in FIG. 6D, the controller 110 and the monitoring circuit 112 included in the controller 110 may sense or recognize that the memory sub-module 130d is mounted on and electrically connected to the memory expander 100 and that the memory sub-module 130a is replaced with the memory sub-module 130d, may generate a replacement completion signal RPL_IDa representing that the memory sub-module 130a has been successfully replaced with the memory sub-module 130d, and may provide the replacement completion signal RPL_IDa to the power controller 120. For example, as with the abnormality signal ABS_IDa, the replacement completion signal RPL_IDa may include the identification IDa of the power management integrated circuit 140a.

Based on the replacement completion signal RPL_IDa, the power controller 120 may generate a power-on signal PONa for controlling the power management integrated circuit 140a to supply the power PWRa to the memory sub-module 130d. For example, as with the power-off signal POFFa, the power-on signal PONa may be included in the power control signal PCONa in FIG. 1.

The power management integrated circuit 140a may supply the power PWRa to the memory sub-module 130d based on the power-on signal PONa. In FIG. 6D, an operation of supplying the power PWRa is illustrated by a solid arrow.

In some example embodiments, after the power PWRa is supplied to the memory sub-module 130d, an initialization operation may be performed on the memory sub-module 130d. After the initialization operation is completed, the memory sub-module 130d may normally operate.

Figure 7:
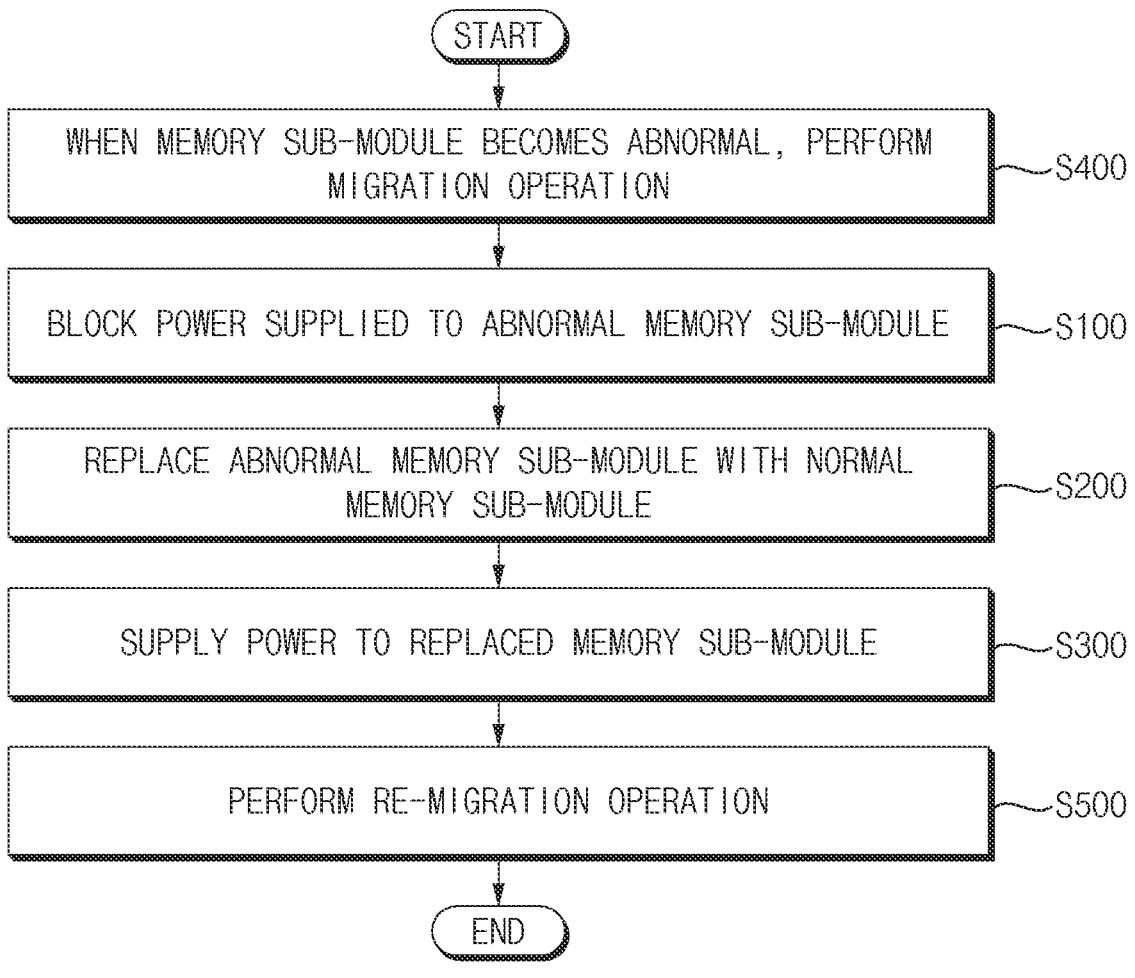
FIG. 7 is a flowchart illustrating a method of operating a memory expander according to example embodiments.
Figure 8A:
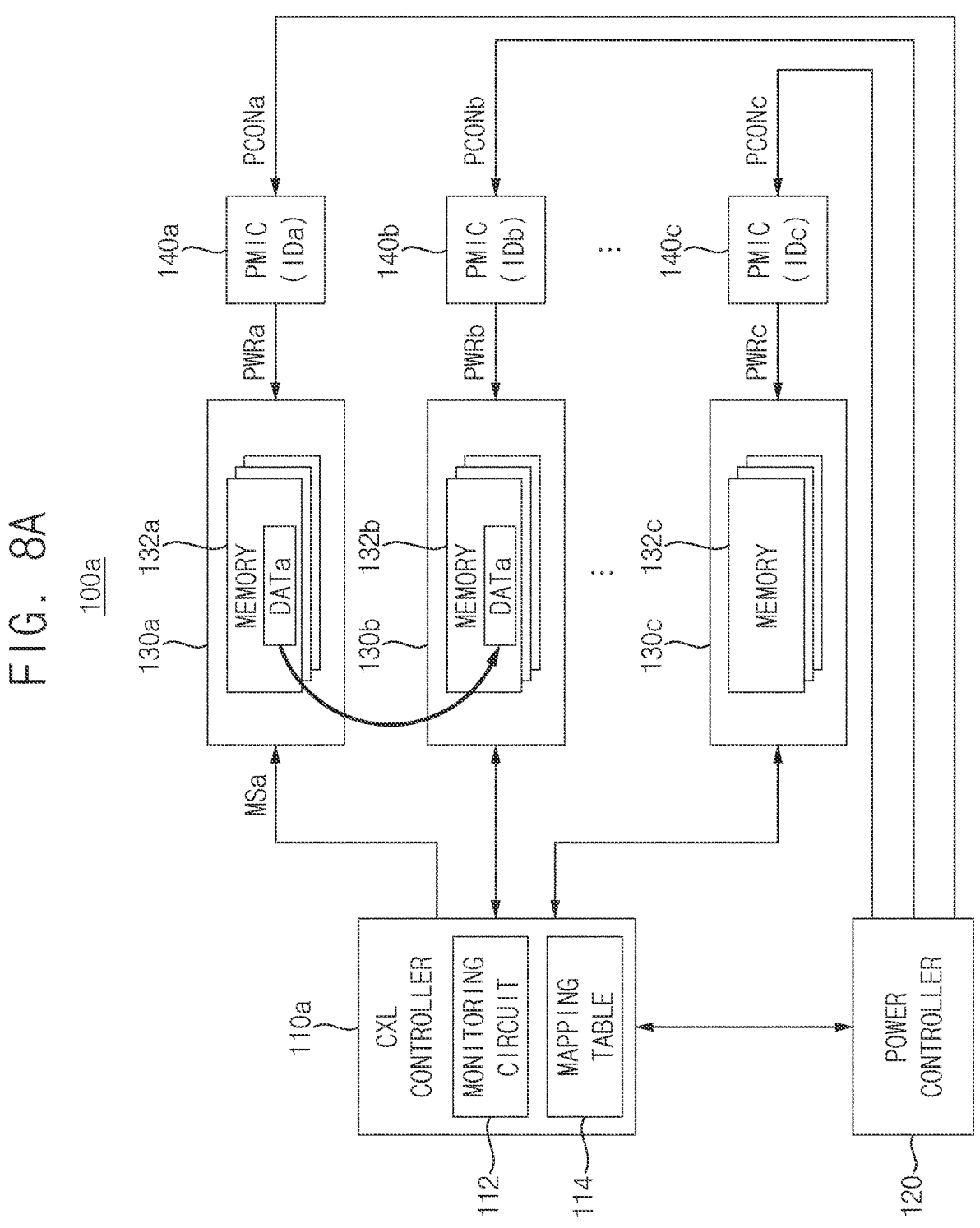
Figure 8C:
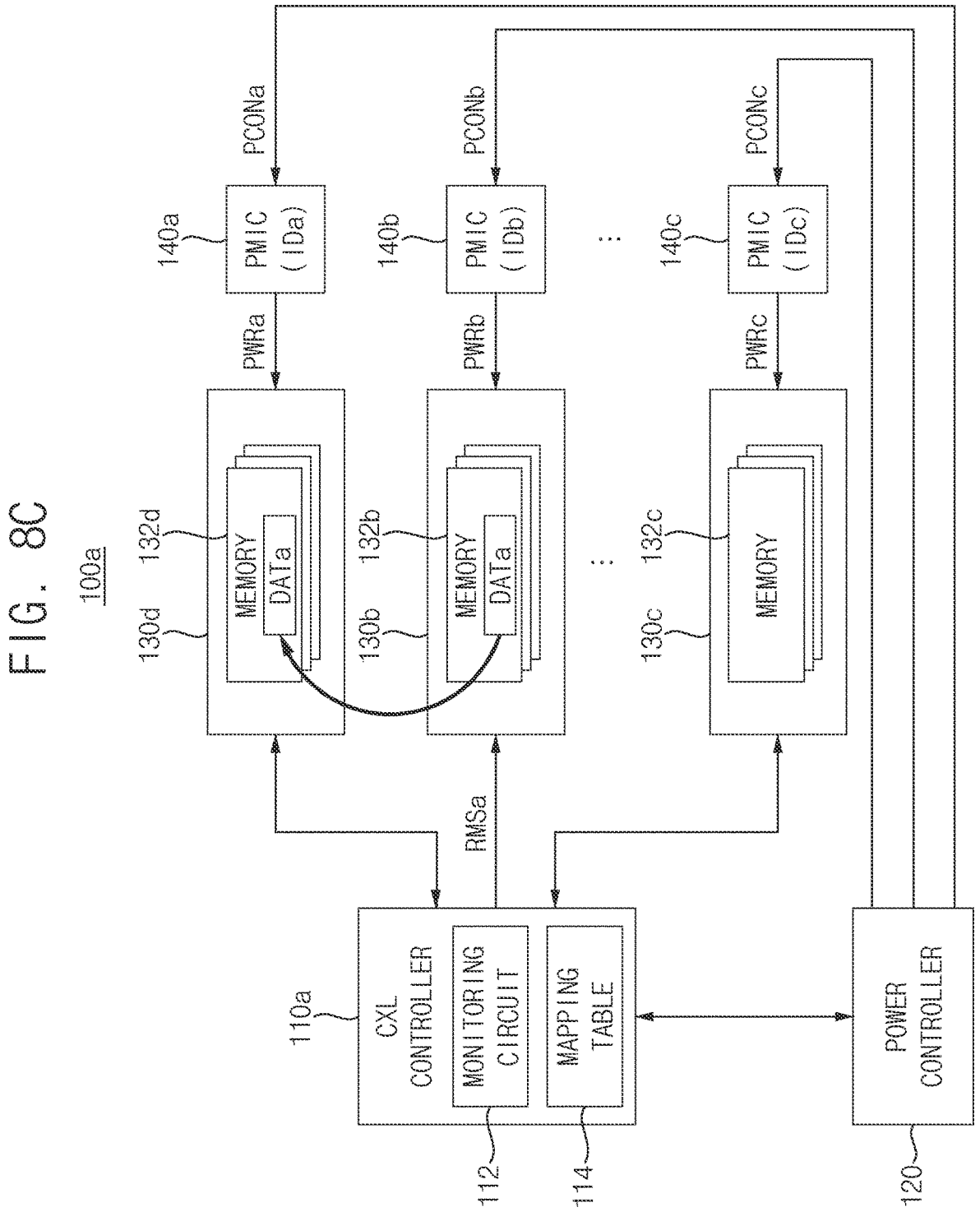

FIG. 7 is a flowchart illustrating a method of operating a memory expander according to example embodiments. FIGS. 8A, 8B, and 8C are diagrams for describing an operation of FIG. 7. The descriptions repeated with FIGS. 5, 6A, 6B, 6C, and 6D will be omitted for brevity.

Referring to FIGS. 7, 8A, 8B, and 8C, in a method of operating a memory expander according to example embodiments, when a specific memory sub-module among the plurality of memory sub-modules 130a to 130c becomes abnormal, a migration operation in which data stored in the abnormal memory sub-module is copied to another memory sub-module may be performed (operation S400), before the power supplied to the abnormal memory sub-module is blocked. Operation S400 may be performed by a controller 110a and the plurality of memory sub-modules 130a to 130c. A memory expander 100a of FIG. 8A may be substantially the same as the memory expander 100 of FIG. 6A, except that a controller 110a is partially changed.

For example, as illustrated in FIG. 8A, when it is determined that the defect has occurred in the memory sub-module 130a among the plurality of memory sub-modules 130a to 130c, the controller 110a may generate a migration control signal (or command) MSa for copying data DATa stored in the memory sub-module 130a to the memory sub-module 130b, and may provide the migration control signal MSa to the memory sub-module 130a, before the abnormality signal ABS_IDa is generated as described with reference to FIG. 6A. For example, the controller 110a may generate the migration control signal MSa such that the data DATa is to be copied to, for example, the memory sub-module 130b (and/or the memory sub-module 130c) having sufficient storage space for storing the data DATa among the remaining memory sub-modules 130b and 130c.

The data DATa stored in the memory sub-module 130a may be copied to the memory sub-module 130b based on the migration control signal MSa. For example, the data DATa may be directly transmitted from the memory sub-module 130a to the memory sub-module 130b, or may be transmitted from the memory sub-module 130a to the memory sub-module 130*b* through the controller 110*a*. In FIG. 8A, an operation of copying the data DATa is illustrated by a thick solid arrow.

Although FIG. 8A illustrates an example where the data DATa stored in the memory sub-module 130*a* is copied to one memory sub-module 130*b*, example embodiments are not limited thereto, and the data DATa stored in the memory sub-module 130*a* may be copied to two or more other memory sub-modules. For example, some of the data DATa may be copied to the memory sub-module 130*b*, and the others of the data DATa may be copied to the memory sub-module 130*c*.

Operations S100, S200, and S300 performed after operation S400 may be substantially the same as those described with reference to FIGS. 5, 6A, 6B, 6C, and 6D.

In some example embodiments, even after the migration operation of S400 is performed, the remaining memory sub-modules 130*b* and 130*c* other than the abnormal memory sub-module 130*a* among the plurality of memory sub-modules 130*a* to 130*c* may be in operation. In some embodiments, the remaining memory sub-modules 130*b* and 130*c* may normally operate. For example, when a read request associated with the data DATa is received from the host device after the migration operation is performed and after the power PWRa supplied to the memory sub-module 130*a* is blocked, the controller 110*a* may perform a re-routing operation for the data DATa such that the data DATa is read or retrieved from the memory sub-module 130*b* rather than the abnormal memory sub-module 130*a*.

In some example embodiments, to perform the above-described re-routing operation, the controller 110*a* may include a mapping table 114. For example, as illustrated in FIG. 8B, the mapping table 114 may include a relationship or correspondence between the data that is a target of the migration operation, an original address of the data, and a migrated address of the data. For example, when the migration operation is performed on the data DATa, a relationship between a first address ADDRa and a second address ADDRb of the data DATa may be recorded in the mapping table 114. The first address ADDRa may represent a storage region of the abnormal memory sub-module 130*a* in which the data DATa has been stored before the migration operation, and the second address ADDRb may represent a storage region of the memory sub-module 130*b* to which the data DATa is copied by the migration operation. Therefore, when the read request associated with the data DATa is received from the host device, the data DATa may be read from the address ADDRb of the memory sub-module 130*b* rather than the address ADDRa of the abnormal memory sub-module 130*a*, using the mapping table 114.

After the abnormal memory sub-module (e.g., memory sub-module 130*a*) is replaced with the normal memory sub-module (e.g., memory sub-module 130*d*) and after the power is supplied to the replaced memory sub-module, a re-migration operation in which the data (e.g., DATa) copied to and stored in another memory sub-module (e.g., memory sub-module 130*b* and/or memory sub-module 130*c*) by the migration operation is copied to the replaced memory sub-module may be performed (operation S500). Operation S500 may be performed by the controller 110*a* and the plurality of memory sub-modules 130*b* to 130*d*.

For example, as illustrated in FIG. 8C, the controller 110*a* may generate a re-migration control signal (or command) RMSa for copying the data DATa stored in the memory sub-module 130*b* to the memory sub-module 130*d*, and may provide the re-migration control signal RMSa to the memory sub-module 130*b*, after the power PWRa is supplied to the memory sub-module 130*d* as described with reference to FIG. 6D.

The data DATa stored in the memory sub-module 130*b* may be copied to the memory sub-module 130*d* based on the re-migration control signal RMSa. For example, the re-migration operation may be performed similarly to the migration operation. For example, after the re-migration operation, the data DATa stored in the memory sub-module 130*b* may be deleted.

As will be appreciated by those skilled in the art, the example embodiments may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 9:
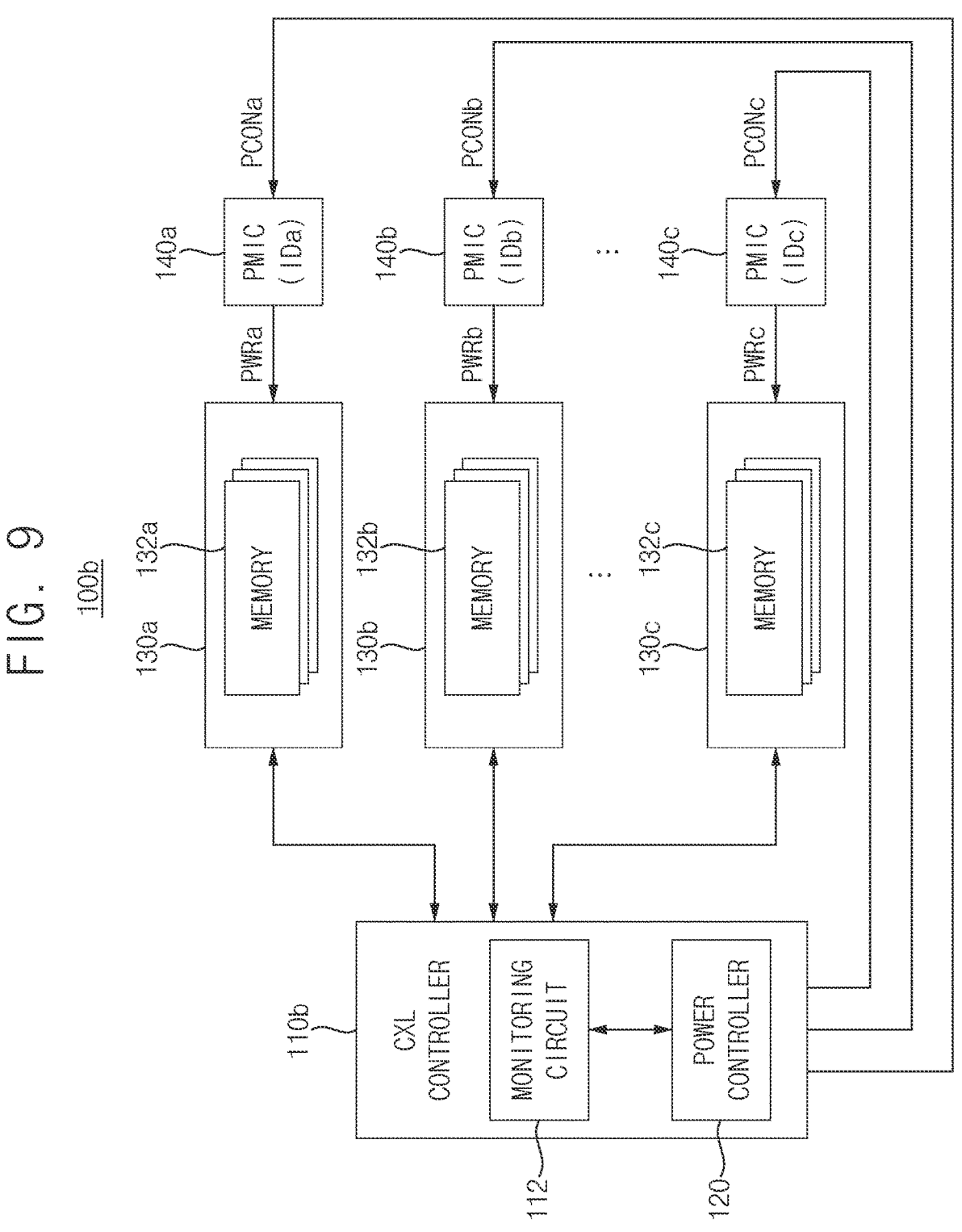
FIG. 9 is a block diagram illustrating a memory expander according to example embodiments.

FIG. 9 is a block diagram illustrating a memory expander according to example embodiments. The descriptions repeated with FIG. 1 will be omitted for brevity.

Referring to FIG. 9, a memory expander 100*b* may include a controller 110*b*, a power controller 120, a plurality of memory sub-modules 130*a* to 130*c*, and a plurality of power management integrated circuits 140*a* to 140*c*.

The memory expander 100*b* may be substantially the same as the memory expander 100 of FIG. 1, except that the power controller 120 is included in the controller 110*b*.

In some example embodiments, the controller 110*b* included in the memory expander 100*b* may include the mapping table 114 described with reference to FIGS. 8A to 8C. In some example embodiments, in the memory expanders 100 and 100*a*, not only the power controller 120 but also the monitoring circuit 112 may be disposed or located outside the controllers 110 and 110*a*.

Figure 10:
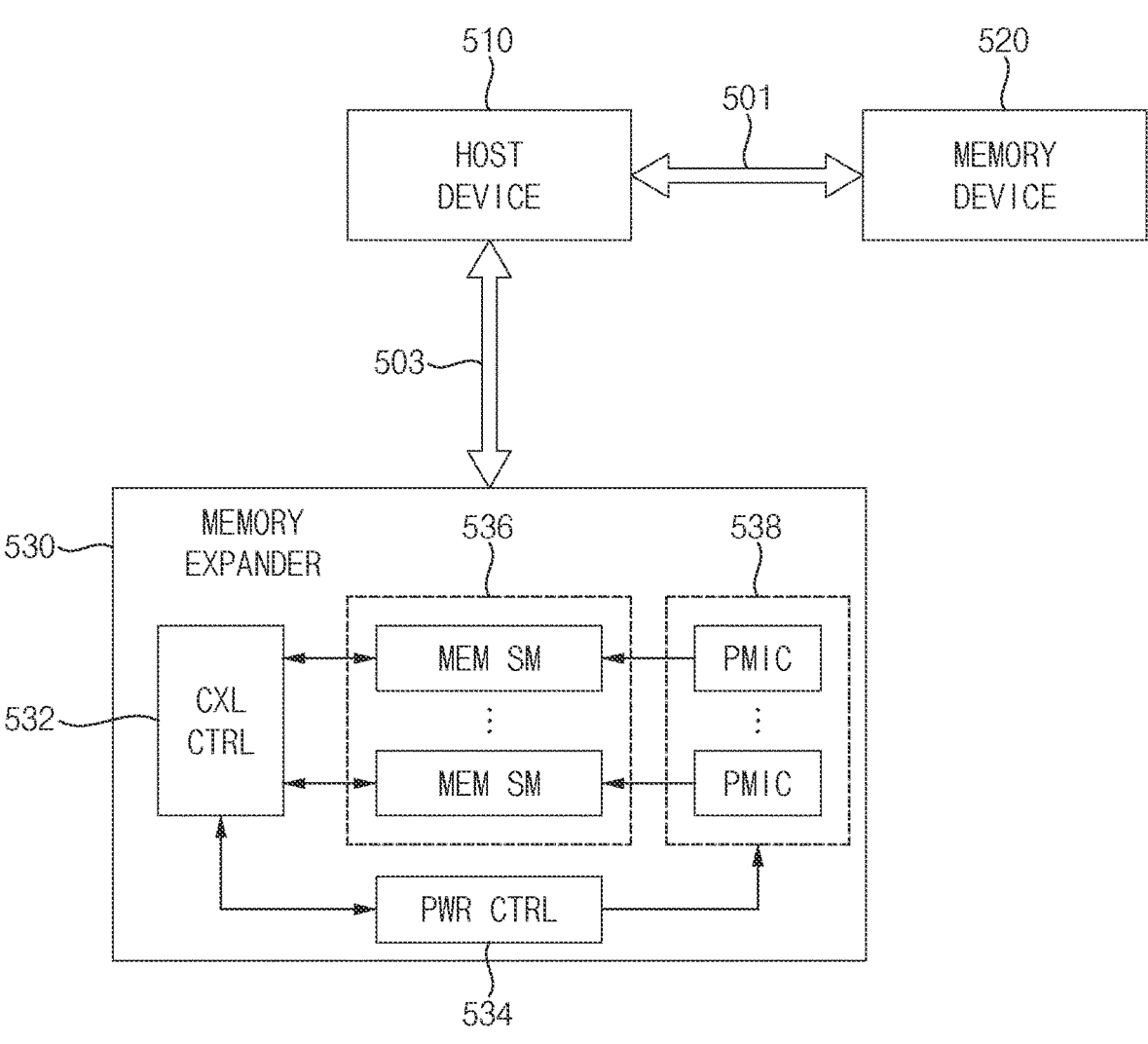
FIGS. 10 and 11 are block diagrams illustrating a computing system including a memory expander according to example embodiments.
Figure 11:
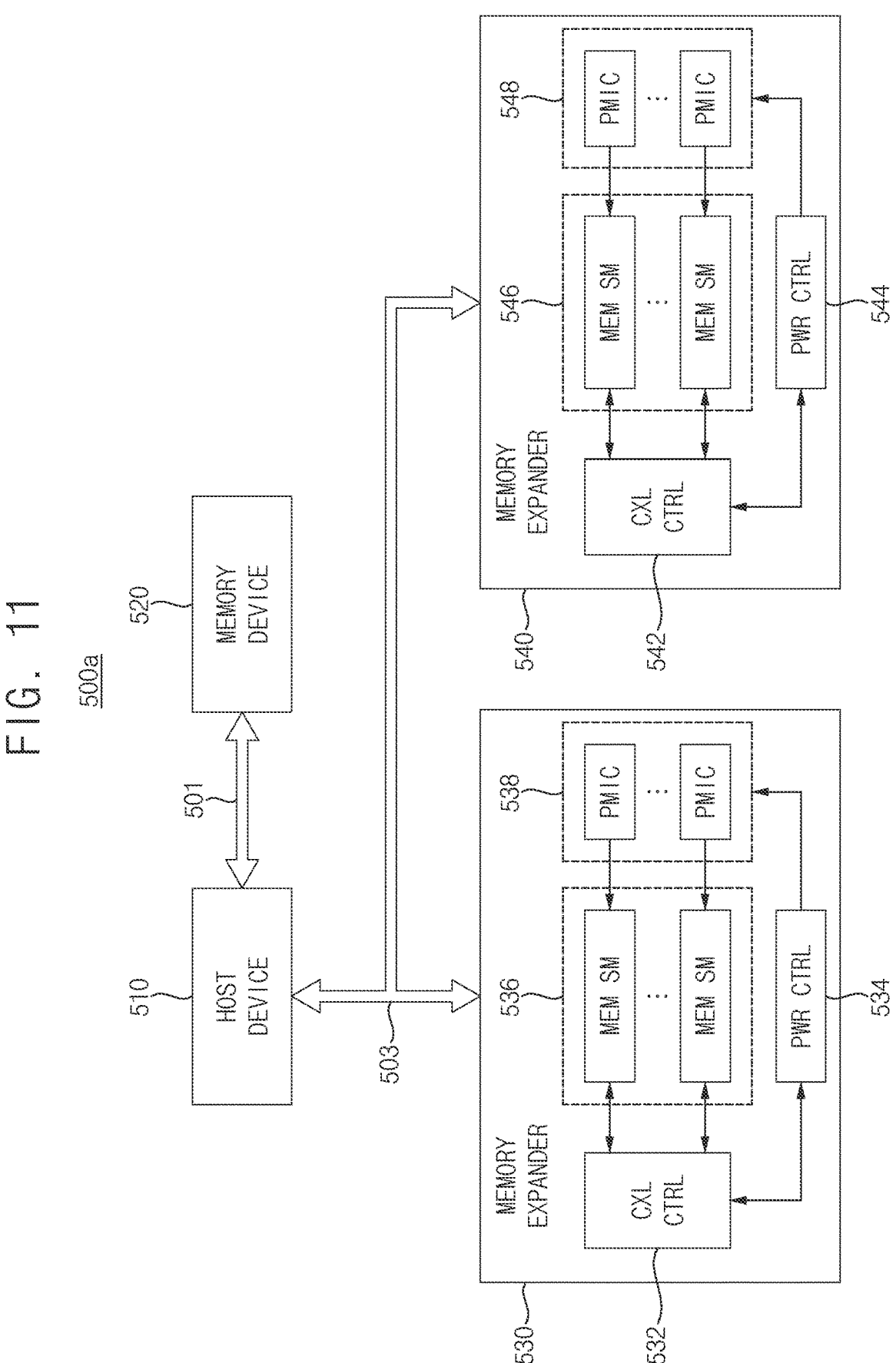

FIGS. 10 and 11 are block diagrams illustrating a computing system including a memory expander according to example embodiments.

Referring to FIG. 10, a computing system 500 may include a host device 510, a memory device 520, and a memory expander 530. The computing system 500 may further include a first bus 501 and a second bus 503.

The host device 510 may control overall operations of the computing system 500. For example, the host device 510 may include at least one of various processing units, e.g., a central processing unit (CPU), etc. For example, the host device 510 may execute an operating system (OS). The operating system may include, for example, a file system for file management and a device driver for controlling peripheral devices including the memory device 520 and the memory expander 530 at the operating system level.

The memory device 520 may be electrically connected to the host device 510 through the first bus 501, and may communicate with the host device 510 through the first bus 501 and a first interface. For example, the memory device 520 may store instructions and/or data that are executed and/or processed by the host device 510. For example, the memory device 520 may be or may include a memory device and/or a memory module based on a dual in-line memory module (DIMM), and may directly communicate with the host device 510. The memory device 520 may be used as a buffer memory, cache memory, or system memory for the host device 510. However, the embodiments of the memory device 520 are not limited to the above-described embodiments.

The memory expander 530 may be electrically connected to the host device 510 through the second bus 503 different from the first bus 501, and may communicate with the host device 510 through the second bus 503 and a second interface different from the first interface. For example, the memory expander 530 may store data that are executed and/or processed by the host device 510. For example, unlike the memory device 520, the memory expander 530 may be electrically connected to the host device 510 without adding memory channels to the host device 510, and thus the memory capacity and the memory bandwidth of the computing system 500 may efficiently increase.

The first bus 501 may be implemented based on the first interface such that the memory device 520 may communicate with the host device 510 through the first interface. In addition, the second bus 503 may be implemented based on the second interface such that the memory expander 530 may communicate with the host device 510 through the second interface. As described above, the memory device 520 and the memory expander 530 may communicate with the host device 510 through different types of interfaces (or heterogeneous interfaces), and thus the computing system 500 may be referred to as a heterogeneous computing system.

In some example embodiments, as described with reference to FIG. 1, the second interface may be a CXL interface. Thus, although not illustrated in FIG. 10, the host device 510 may include a CXL interface to communicate with the memory expander 530. However, example embodiments are not limited thereto, and the host device 510 and the memory expander 530 may communicate with each other using an interface implemented based on at least one of various protocols, such as a Gen-Z protocol, an NVLink protocol, a CCIX protocol, an open CAPI protocol, etc.

The memory expander 530 may be the memory expander according to example embodiments described with reference to FIGS. 1 through 9. For example, the memory expander 530 may include a controller (CXL CTRL) 532, a power controller (PWR CTRL) 534, a plurality of memory sub-modules (MEM SM) 536, and a plurality of power management integrated circuits (PMIC) 538. In some example embodiments, as described with reference to FIGS. 5, 6A, 6B, 6C, and 6D, an abnormal memory sub-module among the plurality of memory sub-modules 536 may be physically replaced with a normal memory sub-module. In some example embodiments, as described with reference to FIGS. 7, 8A, 8B, and 8C, a migration operation for data stored in the abnormal memory sub-module and a re-migration operation for the replaced memory sub-module may be performed. In some example embodiments, the controller 532 may include a monitoring circuit (e.g., the monitoring circuit 112 in FIG. 1) and/or may further include a mapping table (e.g., the mapping table 114 in FIG. 8A). In some example embodiments, the power controller 534 may be included in the controller 532.

In the computing system 500 according to example embodiments, when the abnormality (e.g., defect or failure) has occurred in the specific memory sub-module, only the abnormal memory sub-module may be powered off and replaced with the normal memory sub-module, rather than the entire memory expander 530 is replaced with a normal memory expander. In addition, the remaining memory sub-modules may be in operation during such replacement process. Accordingly, the efficient power management and power repair may be performed, and the performance degradation of the computing system 500 including the memory expander 530 may be reduced.

Referring to FIG. 11, a computing system 500a may include a host device 510, a memory device 520, and memory expanders 530 and 540. The computing system 500a may further include a first bus 501 and a second bus 503.

The computing system 500a may be substantially the same as the computing system 500 of FIG. 10, except that the computing system 500a may further include the memory expander 540.

The memory expander 540 may be substantially the same as the memory expander 530. For example, the memory expander 540 may be electrically connected to the host device 510 through the second bus 503, and may communicate with the host device 510 through the second bus 503 and the second interface. For example, the memory expander 540 may be the memory expander according to example embodiments, and may include a controller 542, a power controller 544, a plurality of memory sub-modules 546, and a plurality of power management integrated circuits 548.

Although an example where the computing system 500a includes two memory expanders 530 and 540 is illustrated, example embodiments are not limited thereto, and the number of memory expanders included in the computing system may be variously determined according to example embodiments.

Figure 12:
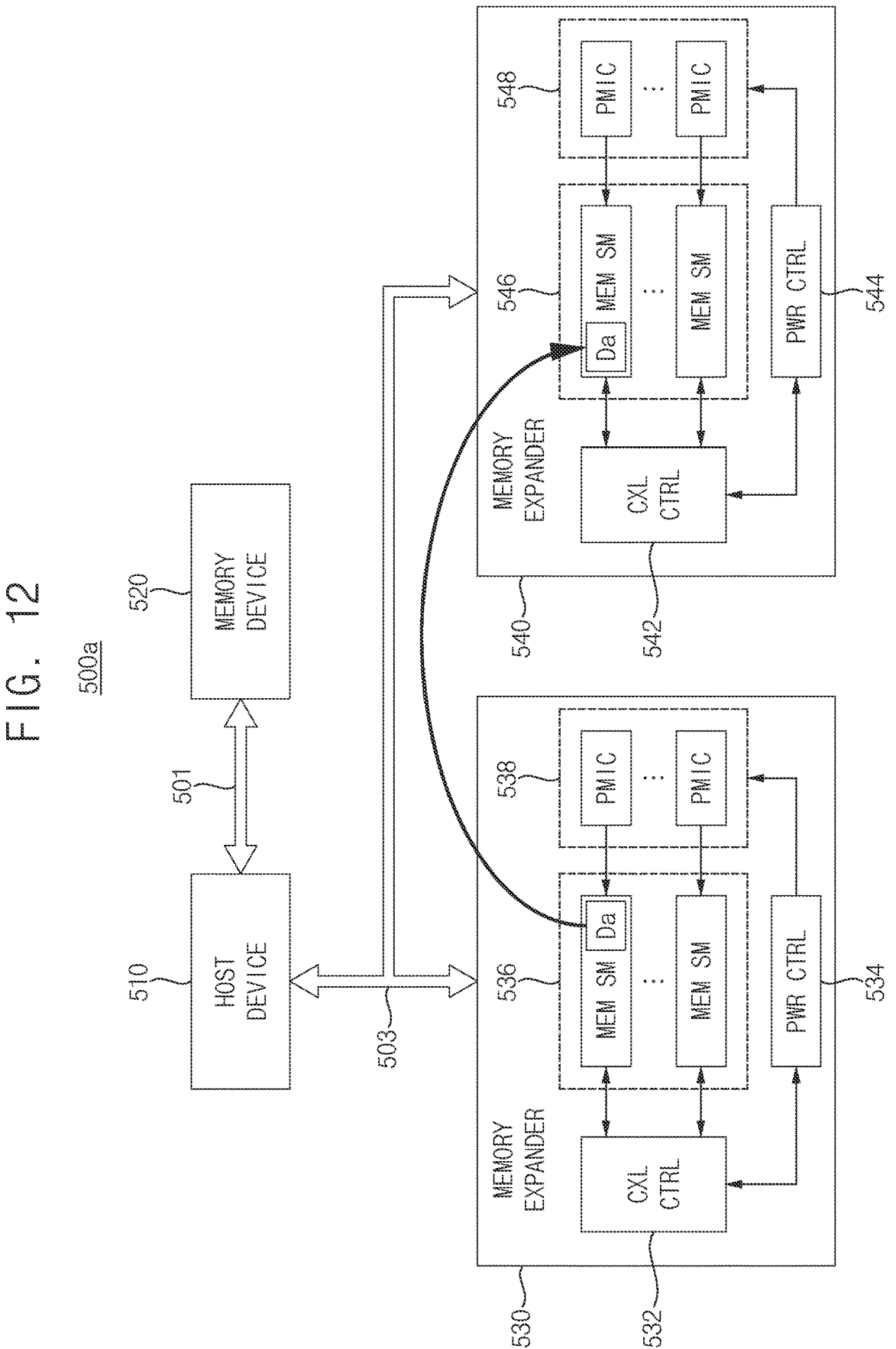
FIG. 12 is a diagram for describing an operation of a computing system of FIG. 11.

FIG. 12 is a diagram for describing an operation of a computing system of FIG. 11.

Referring to FIG. 12, another example of the migration operation described with reference to FIG. 8A is illustrated.

For example, when it is determined that a defect has occurred in one of the plurality of memory sub-modules 536 included in the memory expander 530, a migration operation may be performed on data Da stored in the abnormal memory sub-module. When there is no sufficient storage space for storing the data Da in the remaining memory sub-modules other than the abnormal memory sub-module among the plurality of memory sub-modules 536 included in the memory expander 530, the data Da may be copied to one of the plurality of memory sub-modules 546 included in the memory expander 540 rather than the memory expander 530.

Although not illustrated in detail, after the abnormal memory sub-module included in the memory expander 530 is replaced with the normal memory sub-module, a re-migration operation in which the data Da is copied from one of the plurality of memory sub-modules 546 in the memory expander 540 to the replaced memory sub-module in the memory expander 530 may be performed.

Figure 13:
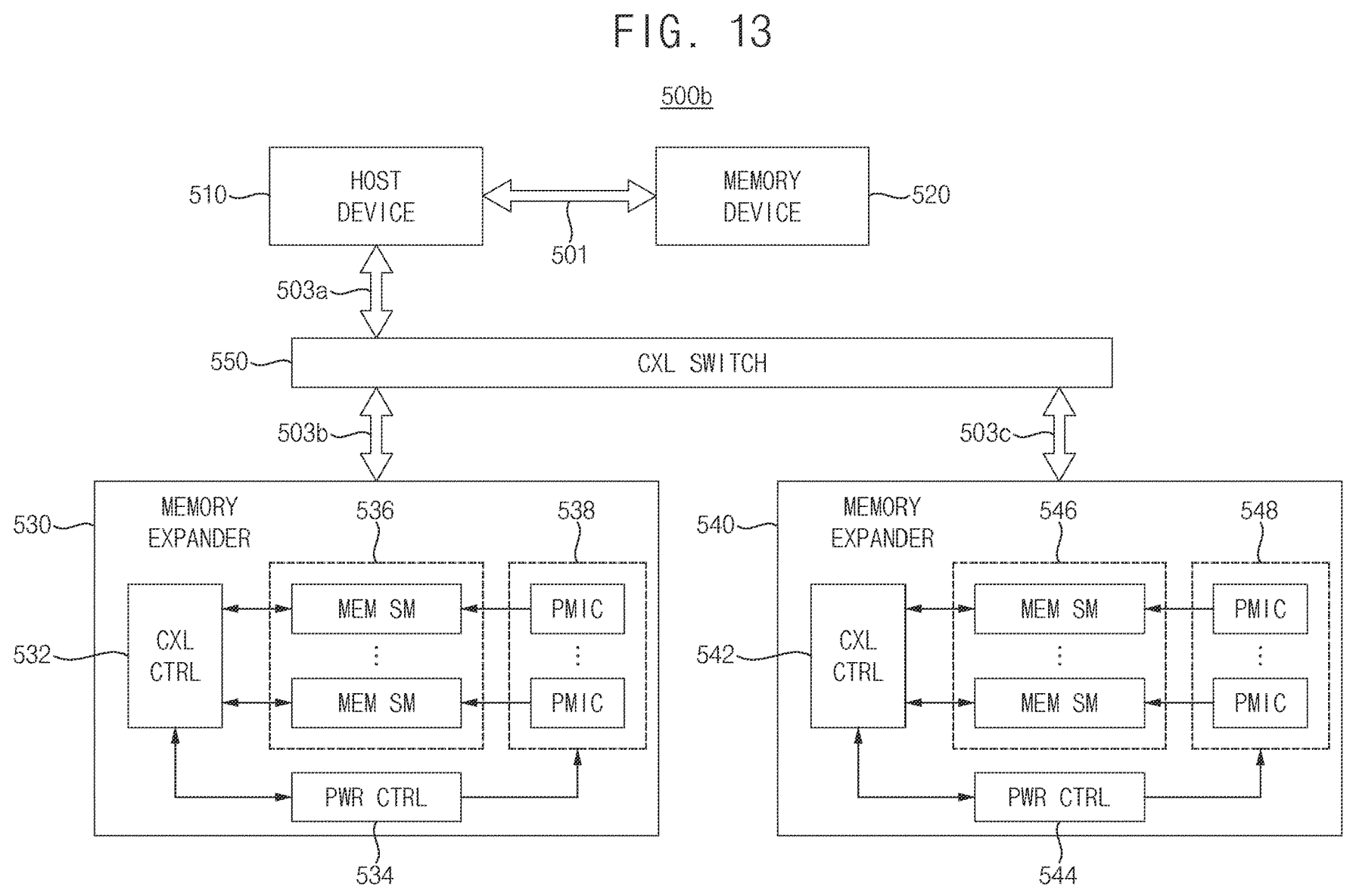
Figure 14:
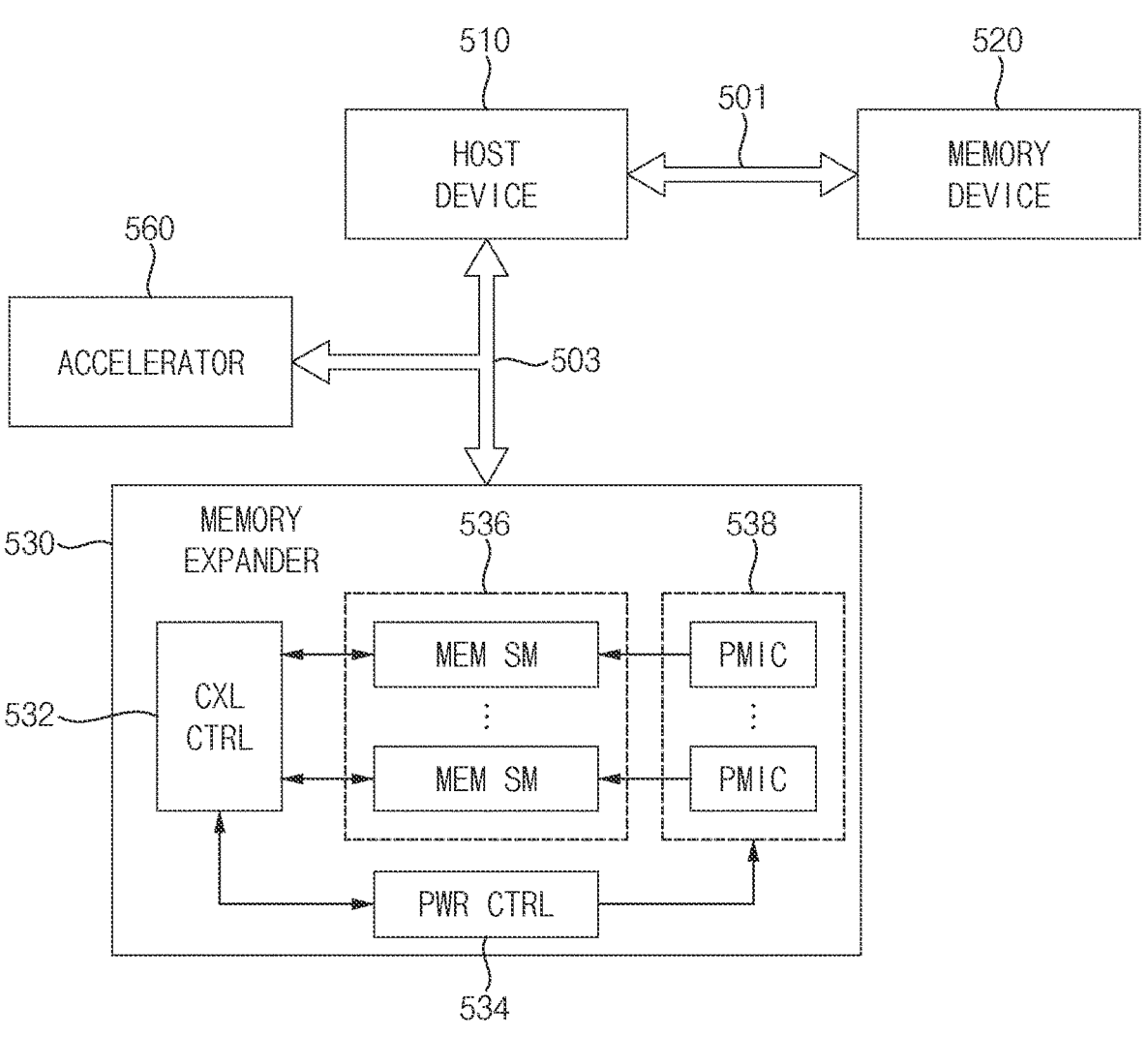

FIGS. 13 and 14 are block diagrams illustrating a computing system including a memory expander according to example embodiments. The descriptions repeated with FIGS. 10 and 11 will be omitted for brevity.

Referring to FIG. 13, a computing system 500b may include a host device 510, a memory device 520, memory expanders 530 and 540, and a switch 550. The computing system 500b may further include a first bus 501 and second buses 503a, 503b, and 503c.

The computing system 500b may be substantially the same as the computing system 500a of FIG. 11, except that the computing system $500b$ may further include the switch $550$ and the second buses $503a$, $503b$, and $503c$ are partially changed.

The switch $550$ may electrically connect the host device $510$ and the memory expanders $530$ and $540$ with each other. For example, the switch $550$ may be electrically connected to the host device $510$ through the second bus $503a$, may be electrically connected to the memory expander $530$ through the second bus $503b$, and may be electrically connected to the memory expander $540$ through the second bus $503c$. The host device $510$ and the memory expanders $530$ and $540$ may communicate with each other through the switch $550$ and the second buses $503a$, $503b$, and $503c$. For example, when the second interface is a CXL interface, the switch $550$ may be referred to as a CXL switch. However, example embodiments are not limited thereto. Alternatively, the switch $550$ may be a network switch.

Referring to FIG. $14$, a computing system $500c$ may include a host device $510$, a memory device $520$, a memory expander $530$, and an accelerator $560$. The computing system $500c$ may further include a first bus $501$ and a second bus $503$.

The computing system $500c$ may be substantially the same as the computing system $500$ of FIG. $10$, except that the computing system $500c$ may further include the accelerator $560$.

The accelerator $560$ may be electrically connected to the host device $510$ and the memory expander $530$ through the second bus $503$, and may communicate with the host device $510$ and the memory expander $530$ through the second bus $503$ and the second interface. For example, the accelerator $560$ may include a processing unit having a type different from that of the processing unit included in the host device $510$. For example, the accelerator $560$ may include at least one of various processing units performing artificial intelligence (AI) computations, e.g., a graphic processing unit (GPU), a tensor processing unit (TPU), a neural processing unit (NPU), a vision processing unit (VPU), etc. However, the embodiments of the accelerator $560$ is not limited thereto.

For example, the accelerator $560$ may perform a computational operation under the control of the host device $510$. For example, the accelerator $560$ may receive a task command from the host device $510$ through the second interface, and may receive data from the memory expander $530$ through the second interface in response to the received task command. The accelerator $560$ may perform the computational operation on the received data, and may store a result of the computational operation in the memory expander $530$ through the second interface.

The computing system $500c$ may include different types of processing units (e.g., the host device $510$ and the accelerator $560$) conjunctly connected with each other, and may perform various functions using the different types of processing units (e.g., heterogeneous processing units). As described above, the memory device $520$ and the memory expander $530$ may communicate with the host device $510$ through different types of interfaces (or heterogeneous interfaces), and different types of processing units (e.g., the host device $510$ and the accelerator $560$) may be included in the computing system $500c$, and thus the computing system $500c$ may be referred to as a heterogeneous computing system.

Although an example where the computing system $500c$ includes one accelerator $560$ is illustrated, example embodiments are not limited thereto, and the number of accelerators included in the computing system may be variously determined according to example embodiments.

In some example embodiments, the computing system may be implemented by combining two or more of the computing systems of FIGS. $11$, $13$, and $14$. For example, the computing system $500c$ of FIG. $14$ may include two or more memory expanders or may further include a switch.

FIG. $15$ is a block diagram illustrating a data center including a memory expander according to example embodiments.

Referring to FIG. $15$, a data center $3000$ may be a facility that collects various types of data and provides various services, and may be referred to as a data storage center. The data center $3000$ may be a system for operating search engines and databases, and may be a computing system used by companies such as banks or government agencies. However, the embodiments of the data center $3000$ is not limited thereto. The data center $3000$ may include application servers $3100_1$ to $3100n$ and storage servers $3200_1$ to $3200m$. The number of the application servers $3100_1$ to $3100n$ and the number of the storage servers $3200_1$ to $3200m$ may be variously selected according to example embodiments, and the number of the application servers $3100_1$ to $3100n$ and the number of the storage servers $3200_1$ to $3200m$ may be various and different from each other.

The application server $3100_1$ may include at least one processor $3110_1$ and at least one memory $3120_1$, and the storage server $3200_1$ may include at least one processor $3210_1$ and at least one memory $3220_1$. An operation of the storage server $3200_1$ will be described as an example. The processor $3210_1$ may control overall operations of the storage server $3200_1$, and may access the memory $3220_1$ to execute instructions and/or data loaded in the memory $3220_1$. The memory $3220_1$ may include at least one of a double data rate (DDR) synchronous dynamic random access memory (SDRAM), a high bandwidth memory (HBM), a hybrid memory cube (HMC), a dual in-line memory module (DIMM), an Optane DIMM, a nonvolatile DIMM (NVDIMM), etc. The number of the processors $3210_1$ and the number of the memories $3220_1$ included in the storage server $3200_1$ may be variously selected according to example embodiments. In some example embodiments, the processor $3210_1$ and the memory $3220_1$ may provide a processor-memory pair. In some example embodiments, the number of the processors $3210_1$ and the number of the memories $3220_1$ may be different from each other. The processor $3210_1$ may include a single core processor or a multiple core processor. The above description of the storage server $3200_1$ may be similarly applied to the application server $3100_1$. The application server $3100_1$ may include at least one storage device $3150_1$, and the storage server $3200_1$ may include at least one storage device $3250_1$. In some example embodiments, the application server $3100_1$ may not include the storage device $3150_1$. The number of the storage devices $3250_1$ included in the storage server $3200_1$ may be variously selected according to example embodiments.

The application servers $3100_1$ to $3100n$ and the storage servers $3200_1$ to $3200m$ may communicate with each other through a network $3300$. The network $3300$ may be implemented using a fiber channel (FC) or an Ethernet, but is not limited thereto. The FC may be a medium used for a relatively high speed data transmission, and an optical switch that provides high performance and/or high availability may be used. The storage servers $3200_1$ to $3200m$ may be provided as file storages, block storages, or object storages according to an access scheme of the network $3300$.

In some example embodiments, the network $3300$ may be a storage-only network or a network dedicated to a storage such as a storage area network (SAN), but is not limited thereto. For example, the SAN may be an FC-SAN that uses an FC network and is implemented according to an FC protocol (FCP). For another example, the SAN may be an IP-SAN that uses a transmission control protocol/internet protocol (TCP/IP) network and is implemented according to an iSCSI (a SCSI over TCP/IP or an Internet SCSI) protocol. In other example embodiments, the network $3300$ may be a general network such as the TCP/IP network. For example, the network $3300$ may be implemented according to at least one of protocols such as an FC over Ethernet (FCoE), a network attached storage (NAS), a nonvolatile memory express (NVMe) over Fabrics (NVMe-oF), etc.

Hereinafter, example embodiments will be described based on the application server $3100_1$ and the storage server $3200_1$. The description of the application server $3100_1$ may be applied to the other application servers (e.g., the application servers $3100_2$ to $3100n$), and the description of the storage server $3200_1$ may be applied to the other storage servers (e.g., the storage servers $3200_2$ to $3200m$).

The application server $3100_1$ may store data requested to be stored by a user or a client into one of the storage servers $3200_1$ to $3200m$ through the network $3300$. In addition, the application server $3100_1$ may obtain data requested to be read by the user or the client from one of the storage servers $3200_1$ to $3200m$ through the network $3300$. For example, the application server $3100_1$ may be implemented as a web server or a database management system (DBMS), but is not limited thereto.

The application server $3100_1$ may access a memory $3120n$ or a storage device $3150n$ included in the other application server $3100n$ through the network $3300$, and/or may access the memories $3220_1$ to $3220m$ or the storage devices $3250_1$ to $3250m$ included in the storage servers $3200_1$ to $3200m$ through the network $3300$. Thus, the application server $3100_1$ may perform various operations on data stored in the application servers $3100_1$ to $3100n$ and/or the storage servers $3200_1$ to $3200m$. For example, the application server $3100_1$ may execute a command for moving or copying data between the application servers $3100_1$ to $3100n$ and/or the storage servers $3200_1$ to $3200m$. The data may be transferred from the storage devices $3250_1$ to $3250m$ of the storage servers $3200_1$ to $3200m$ to the memories $3120_1$ to $3120n$ of the application servers $3100_1$ to $3100n$ directly or through the memories $3220_1$ to $3220m$ of the storage servers $3200_1$ to $3200m$. For example, the data transferred through the network $3300$ may be encrypted data for security or privacy.

In the storage server $3200_1$, an interface $3254_1$ of the storage device $3250_1$ may provide a physical connection between the processor $3210_1$ and a controller $3251_1$ of the storage device $3250_1$, and a physical connection between the controller $3251_1$ and a network interface connector (NIC) $3240_1$, and/or a physical connection between the controller $3251_1$ and a CXL interface controller (CIC) $3260$. For example, the interface $3254_1$ may be implemented based on a direct attached storage (DAS) scheme in which the storage device $3250_1$ is directly connected with a dedicated cable, but is not limited thereto. For example, the interface $3254_1$ may be implemented based on at least one of various interface schemes such as an advanced technology attachment (ATA), a serial ATA (SATA) an external SATA (e-SATA), a small computer system interface (SCSI), a serial attached SCSI (SAS), a peripheral component interconnection (PCI), a PCI express (PCIe), an NVMe, a compute express link (CXL), an IEEE 1394, a universal serial bus (USB), a secure digital (SD) card interface, a multi-media card (MMC) interface, an embedded MMC (eMMC) interface, a universal flash storage (UFS) interface, an embedded UFS (eUFS) interface, a compact flash (CF) card interface, etc.

The storage server $3200_1$ may further include a switch $3230_1$, the NIC $3240_1$, and the CIC $3260_1$. The switch $3230_1$ may selectively (e.g., electrically) connect the processor $3210_1$ with the storage device $3250_1$ or may selectively (e.g., electrically) connect the NIC $3240_1$, the CIC $3260_1$, and/or the storage device $3250_1$ one to another under the control of the processor $3210_1$. Similarly, the application server $3100_1$ may further include a switch $3130_1$, an NIC $3140_1$, and a CIC $3160_1$.

In some example embodiments, the NIC $3240_1$ may include a network interface card, a network adapter, or the like. The NIC $3240_1$ may be electrically connected to the network $3300$ through, for example, a wired interface, a wireless interface, a Bluetooth interface, an optical interface, or the like. The NIC $3240_1$ may further include, for example, an internal memory, a digital signal processor (DSP), a host bus interface, or the like, and may be electrically connected to the processor $3210_1$ and/or the switch $3230_1$ through the host bus interface. The host bus interface may be implemented as one of the above-described examples of the interface $3254_1$. In some example embodiments, the NIC $3240_1$ may be integrated with at least one of the processor $3210_1$, the switch $3230_1$, and the storage device $3250_1$.

In the storage servers $3200_1$ to $3200m$ and/or the application servers $3100_1$ to $3100n$, the processor (e.g., $3110_1$ to $3110n$ and/or $3210_1$ to $3210m$) may transmit a command to the storage devices $3150_1$ to $3150n$ and $3250_1$ to $3250m$ or the memories $3120_1$ to $3120n$ and $3220_1$ to $3220m$ to program or read data. For example, the data may be error-corrected data by an error correction code (ECC) engine. For example, the data may be processed by a data bus inversion (DBI) or a data masking (DM), and may include a cyclic redundancy code (CRC) information, but is not limited thereto. For example, the data may be encrypted data for security or privacy.

The storage devices $3150_1$ to $3150n$ and $3250_1$ to $3250m$ may transmit a control signal and command/address signals to NAND flash memory devices $3252_1$ to $3252m$ of the storage devices $3250_1$ to $3250m$ in response to a read command received from the processor (e.g., $3110_1$ to $3110n$ and/or $3210_1$ to $3210m$). When data is read from the NAND flash memory devices $3252_1$ to $3252m$, a read enable (RE) signal may be input as a data output control signal and may output the data to a DQ bus. A data strobe signal (DQS) may be generated using the RE signal. The command and address signals may be latched in a page buffer based on a rising edge or a falling edge of a write enable (WE) signal.

The controller $3251_1$ may control overall operations of the storage device $3250_1$. In some example embodiments, the controller $3251_1$ may include a static random access memory (SRAM). The controller $3251_1$ may write data into the NAND flash memory device $3252_1$ in response to a write command, or may read data from the NAND flash memory device $3252_1$ in response to a read command. For example, the write command and/or the read command may be provided from the processor $3210_1$ in the storage server $3200_1$, the processor $3210m$ in the other storage server $3200m$, or the processors $3110_1$ to $3110n$ in the application servers $3100_1$ to $3100n$. A DRAM $3253_1$ in the storage device $3250_1$ may temporarily store (e.g., may buffer) data to be written to the NAND flash memory device $3252_1$ or data read from the NAND flash memory device $3252_1$.

Further, the DRAM $3253_1$ may store meta data. The meta data may be data generated by the controller $3251_1$ to manage user data or the NAND flash memory device $3252_1$.

The storage servers $3200_1$ to $3200m$ and the application servers $3100_1$ to $3100n$ may be electrically connected to a memory expander 3400 through the CICs $3160_1$ to $3160n$ and $3260_1$ to $3260m$ and the CXL interface. The memory expander 3400 may be used as an expanded memory of each of the storage servers $3200_1$ to $3200m$ and the application servers $3100_1$ to $3100n$. Each of the storage servers $3200_1$ to $3200m$ and the application servers $3100_1$ to $3100n$ may communicate with each other through the CXL interface and the memory expander 3400.

The memory expander 3400 may be the memory expander according to example embodiments, and may be implemented as described with reference to FIGS. 1 through 14.

The example embodiments may be applied to various electronic devices and systems that include the memory expanders. For example, the example embodiments may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, an automotive, etc.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify an entirety of list of elements and may not modify the individual elements of the list. When referring to "C to D", this means C inclusive to D inclusive unless otherwise specified.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. As used herein, "an element A connected to an element B" (or similar language) may mean that the element A is electrically connected to the element B and/or the element A contacts the element B. It will be understood that when an element or layer is referred to as being "connected to", or "coupled to" another element or layer, it may be directly on, connected to, or coupled to the other element or layer, or one or more intervening elements or layers may be present. In contrast, when an element is referred to as being "directly coupled," "directly connected," or "directly responsive" to, or "directly on," another element, there are no intervening elements present. In addition, "electrical connection" conceptually includes a physical connection and a physical disconnection. In addition, it will also be understood that when an element or layer is referred to as being "between" two elements or layers, it may be the only element or layer between the two elements or layers, or one or more intervening elements or layers may also be present.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A compute express link (CXL) memory device comprising:
   a CXL interface connected to an external device and configured to communicate with the external device;
   a first memory sub-module connected to the CXL interface;
   a second memory sub-module connected to the CXL interface;
   a first power management integrated circuit connected to a first power control signal line and configured to control a first power supplied to the first memory sub-module;
   a second power management integrated circuit connected to a second power control signal line and configured to control a second power supplied to the second memory sub-module;
   a CXL controller configured to check whether read data from each of the first and second memory sub-modules is normal or abnormal; and
   a power controller connected to the first and second power management integrated circuits and configured to transmit first and second power control signals to the first and second power control signal lines, respectively,
   wherein the CXL controller is configured to generate a migration control signal based on a number of uncorrectable errors that occurred in the read data from the first memory sub-module,
   wherein the first memory sub-module is configured to transmit migration data stored in the first memory sub-module to the CXL controller through the CXL interface based on the migration control signal,
   wherein the second memory sub-module is configured to receive the migration data from the CXL controller through the CXL interface based on the migration control signal, and
   wherein the first power management integrated circuit is configured to block the first power to the first memory sub-module based on the first power control signal being an abnormality signal.

2. The CXL memory device of claim 1, wherein the first power management integrated circuit is physically separated from the second power management integrated circuit.

3. The CXL memory device of claim 1, wherein the first power management integrated circuit is configured to operate independently from the second power management integrated circuit.

4. The CXL memory device of claim 1, wherein the first power management integrated circuit is configured to block the first power to the first memory sub-module after the migration data is transmitted from the first memory sub-module to the second memory sub-module.

5. The CXL memory device of claim 1, wherein the second memory sub-module is configured to transmit the migration data stored in the second memory sub-module to the CXL controller through the CXL interface based on a re-migration control signal, wherein a third memory sub-module is configured to receive the migration data from the CXL controller through the CXL interface based on the re-migration control signal, and wherein the third memory sub-module is a new normal memory sub-module replacing the first memory sub-module.

6. The CXL memory device of claim 5, wherein the CXL controller is configured to generate the re-migration control signal after the first memory sub-module is disconnected from the CXL memory device and the third memory sub-module is connected to the CXL memory device replacing the first memory sub-module.

7. The CXL memory device of claim 1, wherein the first memory sub-module is configured to be disconnected from the CXL memory device, when the first power management integrated circuit blocks the first power to the first memory sub-module.

8. The CXL memory device of claim 7, wherein, while the first memory sub-module is disconnected from the CXL memory device, the second memory sub-module is in operation.

9. The CXL memory device of claim 7, wherein, after the first memory sub-module is disconnected from the CXL memory device, a third memory sub-module which is a new normal memory sub-module is configured to be connected to the CXL memory device replacing the first memory sub-module.

10. The CXL memory device of claim 9, wherein, after the first memory sub-module is replaced with the third memory sub-module, the CXL controller is configured to generate a first replacement completion signal, the power controller is configured to generate a first power-on signal based on the first replacement completion signal, and the first power management integrated circuit is configured to supply the first power to the third memory sub-module based on the first power-on signal.

11. The CXL memory device of claim 1, wherein the CXL controller includes:

a mapping table that includes a relationship between a first address and a second address, wherein the first address includes information of a storage region of the first memory sub-module in which the migration data is stored, and the second address includes information of a storage region of the second memory sub-module to which the migration data is copied.

12. The CXL memory device of claim 11, wherein, when a read request associated with the migration data is received from the external device after the first power management integrated circuit blocks the first power to the first memory sub-module, the migration data is read from the second memory sub-module using the mapping table.

13. The CXL memory device of claim 1, further comprising:

a substrate; and a plurality of slots on the substrate, wherein each of the first and second memory sub-modules is configured to be electrically attachable to and detachable from the CXL memory device through the plurality of slots.

14. The CXL memory device of claim 1, wherein the first and second power management integrated circuits include first and second identifications, respectively, and wherein the power controller is configured to independently control the first and second power management integrated circuits using the first and second identifications.

15. The CXL memory device of claim 1, wherein the CXL interface is included in the CXL controller.

16. The CXL memory device of claim 1, wherein the power controller is included in the CXL controller.

17. A computing system comprising:

a host device; and a first compute express link (CXL) memory device connected to the host device, wherein the first CXL memory device includes:

a CXL interface connected to the host device and configured to communicate with the host device;

a first memory sub-module connected to the CXL interface;

a second memory sub-module connected to the CXL interface;

a first power management integrated circuit connected to a first power control signal line and configured to control a first power supplied to the first memory sub-module;

a second power management integrated circuit connected to a second power control signal line and configured to control a second power supplied to the second memory sub-module;

a CXL controller configured to check whether read data from each of the first and second memory sub-modules is normal or abnormal; and a power controller connected to the first and second power management integrated circuits and configured to transmit first and second power control signals to the first and second power control signal lines, respectively, wherein the CXL controller is configured to generate a migration control signal based on a number of uncorrectable errors that occurred in the read data from the first memory sub-module, wherein the first memory sub-module is configured to transmit migration data stored in the first memory sub-module to the CXL controller through the CXL interface based on the migration control signal, wherein the second memory sub-module is configured to receive the migration data from the CXL controller through the CXL interface based on the migration control signal, and wherein the first power management integrated circuit is configured to block the first power to the first memory sub-module based on the first power control signal being an abnormality signal.

18. The computing system of claim 17, further comprising:

a second CXL memory device connected to the host device, and wherein a third memory sub-module included in the second CXL memory device is configured to receive the migration data from the CXL controller through the CXL interface based on the migration control signal.

19. The computing system of claim 18, further comprising:

a switch connecting the host device, the first CXL memory device and the second CXL memory device with each other.

20. The computing system of claim 17, further comprising:

an accelerator connected to the host device and the first CXL memory device.

\* \* \* \* \*